(12) United States Patent
Kokabu et al.

(10) Patent No.: US 10,181,417 B2
(45) Date of Patent: Jan. 15, 2019

(54) SUBSTRATE TREATING APPARATUS AND SUBSTRATE TRANSPORTING METHOD

(71) Applicant: SCREEN Semiconductor Solutions Co., Ltd., Kyoto (JP)

(72) Inventors: Yoshinori Kokabu, Kyoto (JP); Kazuhiro Nishimura, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 122 days.

(21) Appl. No.: 14/644,280

(22) Filed: Mar. 11, 2015

(65) Prior Publication Data

US 2015/0279713 A1    Oct. 1, 2015

(30) Foreign Application Priority Data

Mar. 31, 2014   (JP) ................................ 2014-073073

(51) Int. Cl.
    *H01L 21/677* (2006.01)
    *H01L 21/67* (2006.01)
(52) U.S. Cl.
    CPC .. *H01L 21/67745* (2013.01); *H01L 21/67276* (2013.01); *H01L 21/67742* (2013.01); *H01L 21/67748* (2013.01); *H01L 21/67754* (2013.01)
(58) Field of Classification Search
    CPC ......... H01L 21/67201; H01L 21/67276; H01L 21/67754; H01L 21/67745
    USPC ....................................... 414/217, 267, 268
    See application file for complete search history.

(56) References Cited

U.S. PATENT DOCUMENTS

| | | | |
|---|---|---|---|
| 5,972,110 A * | 10/1999 | Akimoto | H01L 21/67161 118/319 |
| 6,454,472 B1 | 9/2002 | Kim et al. | 396/611 |
| 2007/0056514 A1* | 3/2007 | Akimoto | H01L 21/67173 118/716 |
| 2011/0063588 A1* | 3/2011 | Kashiyama | G03F 7/2028 355/27 |
| 2012/0008936 A1 | 1/2012 | Matsuoka et al. | 396/611 |
| 2014/0003890 A1* | 1/2014 | Goto | H01L 21/67742 414/217 |

FOREIGN PATENT DOCUMENTS

| | | |
|---|---|---|
| JP | 3337677 | 10/2002 |
| JP | 2006-216614 | 8/2006 |
| JP | 2012-033863 | 2/2012 |

* cited by examiner

*Primary Examiner* — Ronald P Jarrett
(74) *Attorney, Agent, or Firm* — Ostrolenk Faber LLP

(57) ABSTRACT

A substrate transport mechanism receives two substrates from an upstream ID section using two arms of three arms. The substrate transport mechanism delivers one of the two substrates to and from an individual processing unit of a processing block using one of arms holding the one of the two substrates to be subjected to a given process by the processing block and one of the arms holding no substrate. The substrate transport mechanism then keeps holding the other substrate with the remaining one arm of the arms having received the substrates while the processing unit processes the substrate. The substrate transport mechanism transfers the two substrates to a downstream processing block using the one arm holding the substrate subjected to the given process by the processing block and the one arm holding the other substrate.

18 Claims, 17 Drawing Sheets

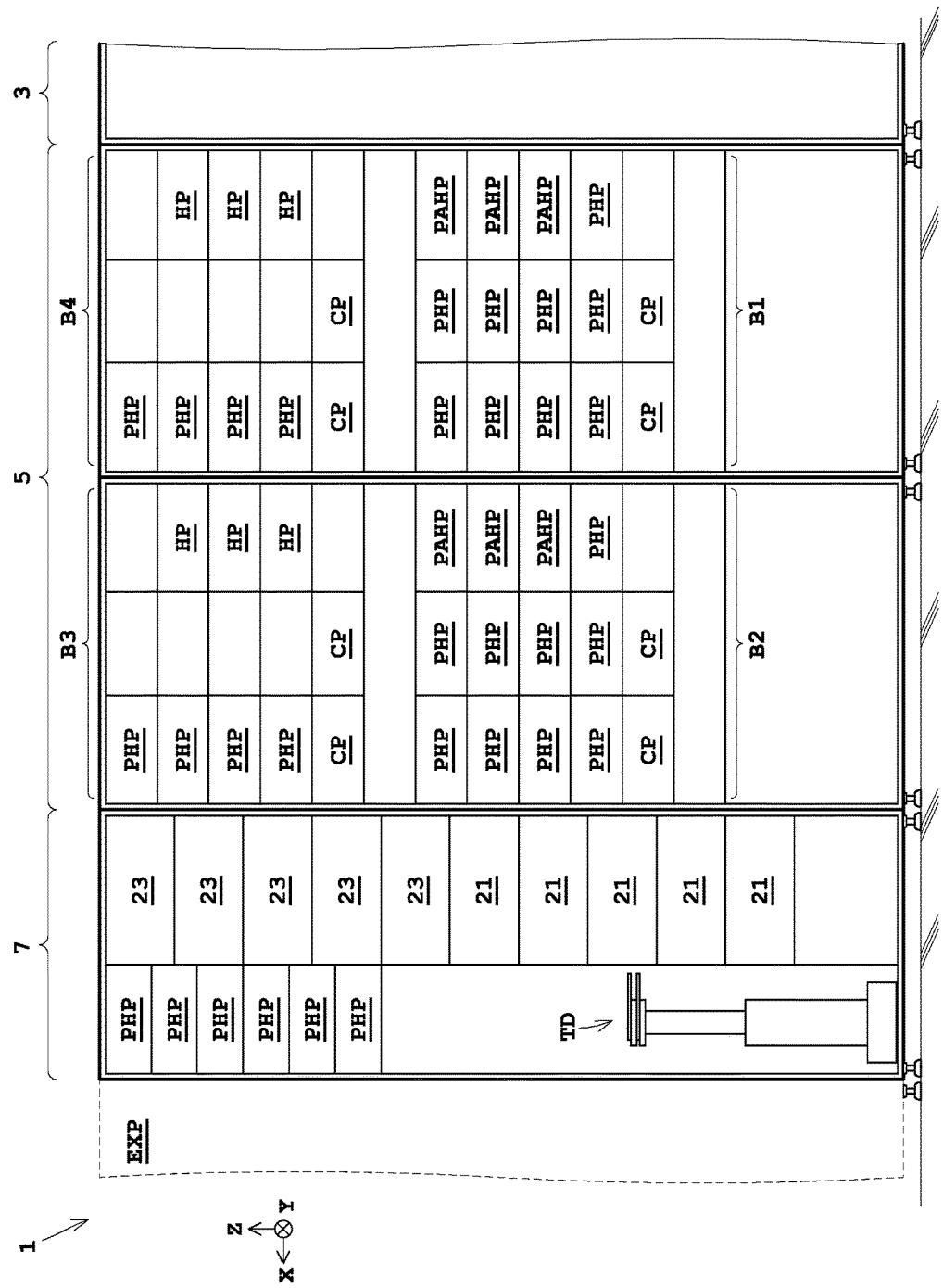

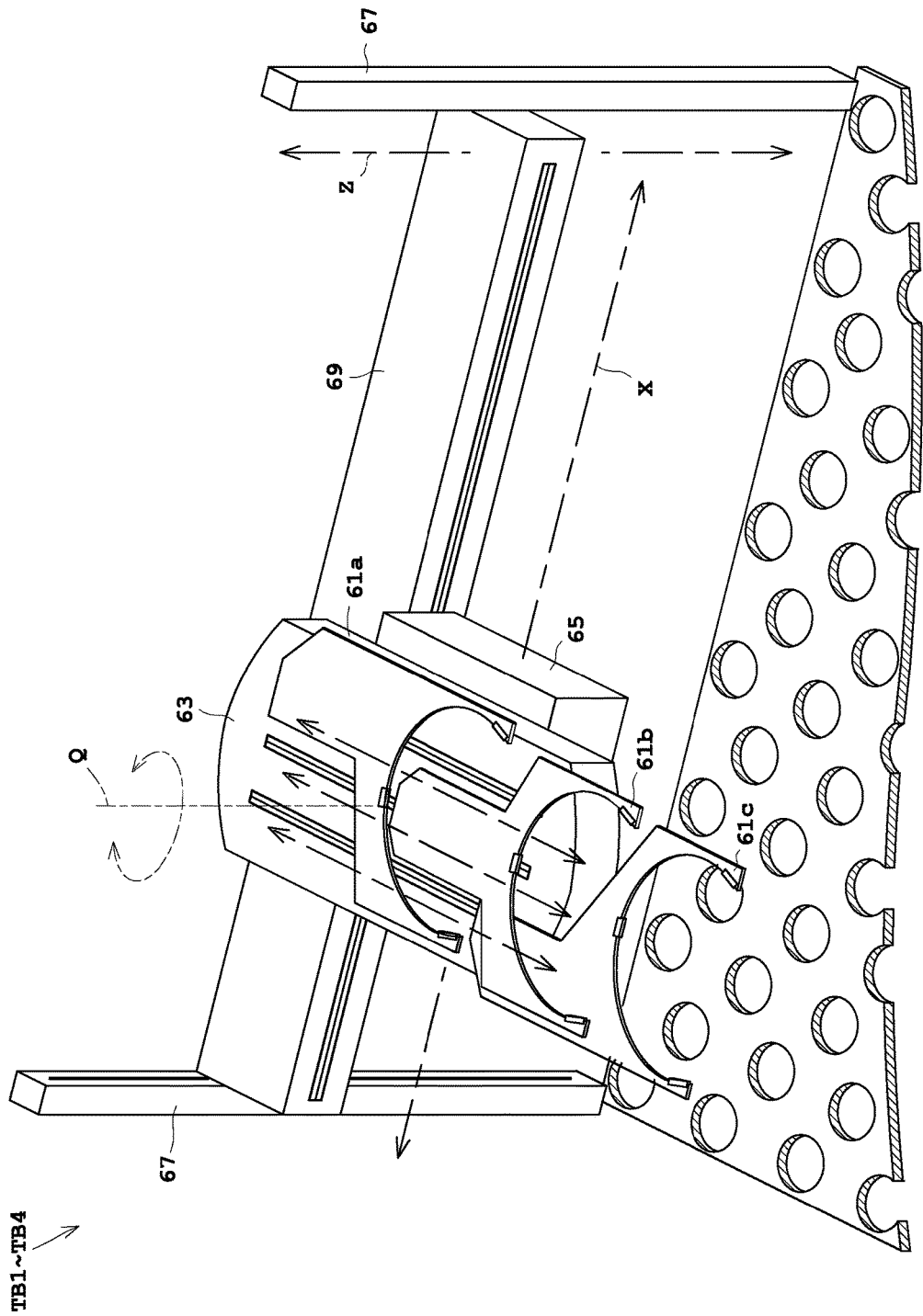

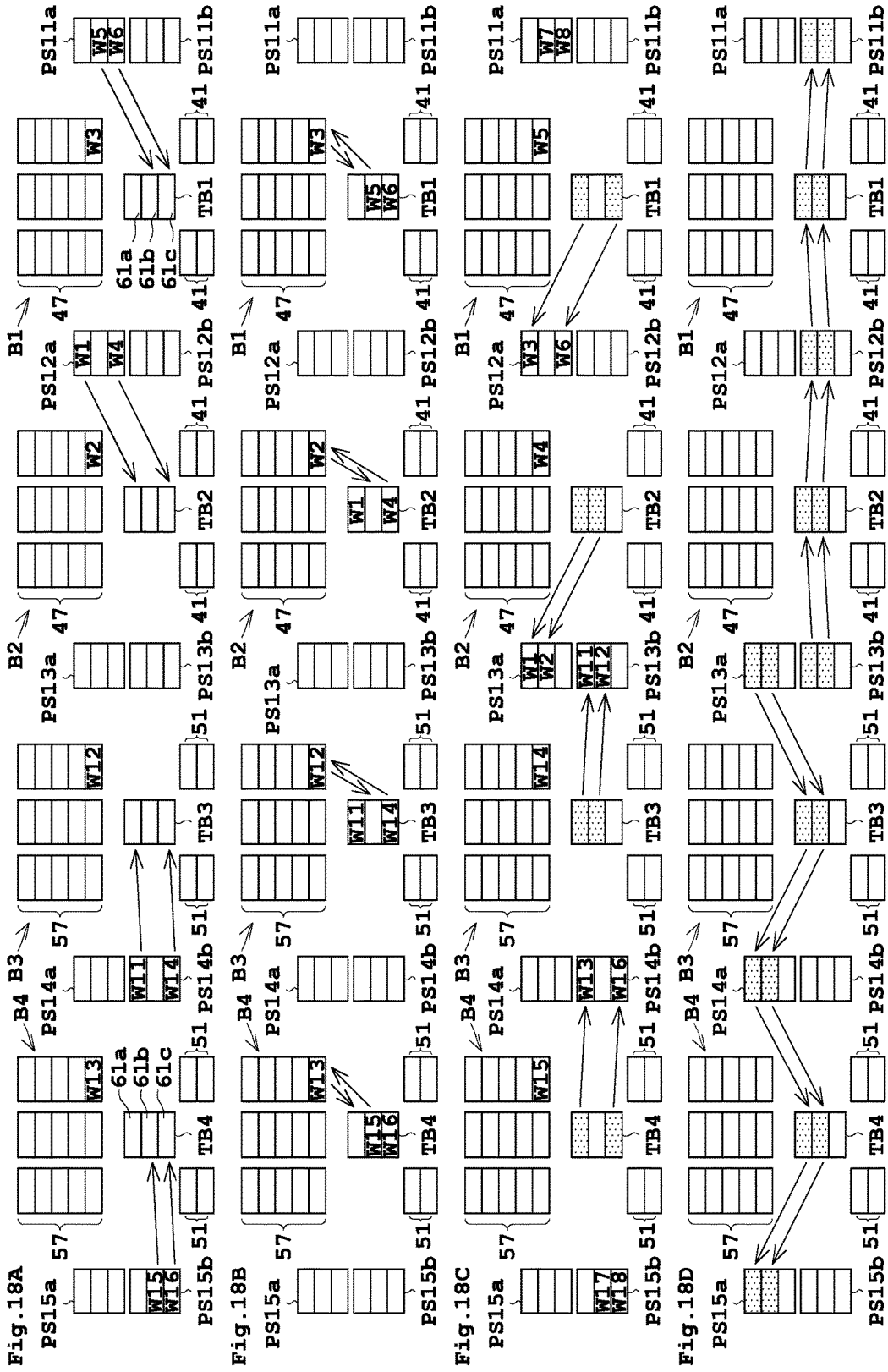

SUBSTRATE TREATING APPARATUS AND SUBSTRATE TRANSPORTING METHOD

CROSS-REFERENCE TO RELATED APPLICATIONS

This application claims priority to Japanese Patent Application No. 2014-073073 filed Mar. 31, 2014 the subject matter of which is incorporated herein by reference in entirety.

TECHNICAL FIELD

The present invention relates to a substrate treating apparatus and a substrate transporting method for the substrate treating apparatus performing a series of processes to a semiconductor substrate, a glass substrate for liquid crystal display, a photo-mask glass substrate, an optical disk substrate, and the like (hereinafter, simply referred to as a "substrate").

BACKGROUND ART

FIG. 1 illustrates a currently-used substrate treating apparatus provided with an indexer 103, a processor 105, and an interface 107. Moreover, the processor 105 includes an application processing block B101 and a developing processing block B102. The application processing block B101 forms a coating film, such as a resist film, on a substrate W. The developing processing block B102 develops the substrate W. The processing blocks B101 and B102 each include a single substrate transport mechanism with arms for holding the substrate W, and various types of processing units. See, for example, Japanese Patent No. 3337677, Japanese Patent Publications No. 2012-033863A and 2006-216614A.

The indexer 103 feeds out the substrate W to be processed in the processing blocks B101 and B102. The indexer 103 includes a mount table 109, and an indexer transport mechanism (not shown). The mount table 109 holds a carrier C accommodating a plurality of substrates W. The indexer transport mechanism ejects the substrate W from the carrier C and places the substrate W into the carrier C. The processing blocks B101 and B102 each can perform either transfer or receipt of the substrate W to or from an external apparatus EXP, such as an exposure apparatus, via the interface 107.

The processor 105 of the substrate treating apparatus illustrated in FIG. 1 has a laminated structure whose lower layer corresponds to the application processing block B101 and whose upper layer corresponds to the developing processing block B102. The substrate W from the carrier C of the indexer 103 is fed out through the application processing block B101 and the interface 107, in this order, to the exposure apparatus EXP as the external apparatus. The exposure apparatus EXP performs exposure processing to the substrate W. The substrate W subjected to the exposure processing is fed back through the interface 107 and the developing processing block B102, in this order, to the indexer 103 by which the substrate W is placed into the carrier C. That is, the substrate W is transported in the processing blocks B101 and B102 each in one direction so as to circulate within the substrate treating apparatus.

SUMMARY OF INVENTION

Technical Problem

However, the example of the currently-used apparatus with such a construction has the following drawbacks. That is, the substrate treating apparatus obtains an enhanced substrate throughput by an approach of laminating other processing blocks vertically in addition to the two processing blocks B101 and B102 to perform further parallel processing. However, such an approach possesses a restriction in height. Then, another approach has been suggested in Japanese Patent Publication No. 2006-216614A and FIG. 2 in which other processing blocks B101 and B102 are arranged along transportation paths RA and RB, respectively. However, such an approach causes a drawback that parallel processing among a plurality of processing blocks performing the same processing (e.g., application processing) has a degraded processing efficiency.

Specifically, in the upstream processing block (see numeral BX) in FIG. 2, the substrate transport mechanism receives the substrate W from the mount table, and replaces the substrate W between various processing units using original two arms. However, the substrate transport mechanism also has to transport a substrate W to the downstream processing block for parallel processing in addition to the replacement of the substrate W. In the downstream processing block, the substrate transport mechanism also has to transport the substrate W subjected to a given process in the upstream processing block for parallel processing in addition to the replacement of the substrate W to the various processing units. Accordingly, the upstream and downstream processing blocks each have the increased number of transporting steps. When the upstream and downstream processing blocks each have different numbers of transporting steps, the processing blocks each have various periods of time for processing. This results in a longer period of time for the processing depending on the number of substrate transportation steps to the other processing blocks for the parallel processing.

The present invention has been made regarding the state of the art noted above, and its one object is to provide a substrate treating apparatus and a substrate transporting method that allow suppressed reduction in processing efficiency of parallel processing among a plurality of processing blocks when the processing blocks for performing the same processing are arranged along the same transportation path.

Solution to Problem

The present invention is constituted as stated below to achieve the above object. One embodiment of the present invention discloses a substrate treating apparatus for treating substrates. The substrate treating apparatus includes n processing blocks arranged along an identical transportation path and performing an identical process to the substrates, the n being a natural number of 2 or larger. An individual processing block of the n processing blocks includes at least one processing unit performing a process set in advance to the substrates, and a single substrate transport mechanism having n+1 arms holding the substrates. The substrate transport mechanism receives n substrates of the substrates from an upstream processing block using n arms of the n+1 arms. The substrate transport mechanism delivers one substrate of the n substrates to and from the processing unit in the processing block using one arm of the n arms holding the one substrate of the n substrates to be subjected to a given process by the processing block and one arm of the n arms holding no substrate. The substrate transport mechanism keeps holding n−1 substrate or substrates of the n substrates using remaining n−1 arm or arms of the n arms with which the n substrates are received while the processing unit processes the one substrate. The substrate transport mechanism transfers the n substrates to a downstream block using the one arm of the n arms holding the one substrate subjected to the given process by the processing block and the n−1 arm or arms holding the n−1 substrate or substrates.

The substrate transport mechanism of the substrate treating apparatus according to the embodiment of the present invention includes the n+1 arms corresponding to the n processing blocks. The substrate transport mechanism receives n substrates of the substrates from the upstream processing block of the n processing blocks with the n arms of the n+1 arms. The substrate transport mechanism delivers the n substrates to and from the processing unit in the processing block using one arm of the n arms holding the one substrate of the n substrates to be subjected to a given process by the processing block and one arm holding no substrate. The substrate transport mechanism keeps holding n−1 substrate or substrates of the n substrates using remaining n−1 arm or arms of the n arms with which the n substrates are received while the processing unit processes the one substrate. The substrate transport mechanism transfers the n substrates to a downstream processing block of the processing blocks using the one arm holding the one substrate subjected to the given process by the processing block and the n−1 arm or arms holding the n−1 substrate or substrates.

Specifically, the substrate transport mechanism delivers the substrate to and from the processing unit (i.e., replaces the substrate) in one of the processing blocks as usual while holding the substrate to be passed through the processing block using the n−1 arms for performing processing in the processing block. Likewise, the substrate transport mechanism transports the substrate to an adjacent processing block to perform the same processing. This results in a reduced number of transportation steps. In addition, the processing blocks have approximately the same number of substrate transportation steps to the processing units. This achieves substantially the same time for processing in the processing blocks. Accordingly, suppressing reduction in processing efficiency of parallel processing among the processing blocks is obtainable.

Moreover, it is preferable that the substrate transport mechanism of the substrate treating apparatus further includes an arm holding table holding the arms so as for the arms to be movable horizontally and to be movable along the transportation path, and the substrate transport mechanism receives the n substrates from the upstream processing block when the arm holding table is located adjacent to the upstream processing block on the transportation path. Moreover, it is preferable that the substrate transport mechanism further includes an arm holding table holding the arms so as for the arms to be movable horizontally and to be movable along the transportation path, and the substrate transport mechanism transfers the n substrates to the downstream processing block when the arm holding table is located adjacent to the downstream processing block on the transportation path.

This achieves suppression of reduction in processing efficiency of the parallel processing among the processing blocks when the substrate transport mechanism receives the n substrates from the upstream processing block or transfers the n substrates to the downstream processing block while the arm holding table holding the arms moves.

Moreover, it is preferable that the substrate transport mechanism of the substrate treating apparatus receives the n substrates simultaneously from the upstream processing block. Moreover, it is preferable that the substrate transport mechanism of the substrate treating apparatus transfers the n substrates simultaneously to the downstream processing block. This achieves a shortened substrate transportation time, resulting in enhanced throughput of the substrate treating apparatus.

Moreover, it is preferable that the substrate treating apparatus further includes a mount table between the adjacent upstream and downstream processing blocks for placing the substrate so as to perform either transfer or receipt of the substrate to or from the processing block. This allows either transfer or receipt of the substrate between the adjacent processing blocks while the substrate is placed on the mount table. Accordingly, simple substrate transportation is obtainable.

Moreover, it is preferable that the mount table of the substrate treating apparatus allows placement of the n+1 substrates as well as either transfer or receipt of the substrates using the n+1 arms simultaneously. This achieves a shortened substrate transportation time in the mount table, resulting in enhanced throughput of the substrate treating apparatus.

Moreover, it is preferable that the substrate transport mechanism of the substrate treating apparatus delivers the substrate to and from the processing unit of the processing block below the arm holding the substrate. Accordingly, even when the arm, other than the arms holding the substrates, delivering the substrate to and from the individual processing unit generates dust due to the delivery of the substrate, the arm allows prevention of dust adhesion onto the held substrates.

Moreover, the substrate treating apparatus of the embodiment includes the transportation path having first and second transportation paths arranged in parallel. The processing block performs processing while transporting the substrate along the first transportation path in a first direction, and performs processing, different from the processing along the first transportation path, while transporting the substrate along the second transportation path in a second direction opposite to the first direction. This achieves circulating transportation of the substrates in one direction along the transportation path in the substrate treating apparatus, resulting in enhanced throughput of the substrate treating apparatus.

Moreover, the substrate treating apparatus of the embodiment includes the transportation path having first and second transportation paths arranged in series. The processing block performs processing along the first transportation path while transporting the substrate along the first and second transportation paths in a first direction, and performs processing along the second transportation path, different from the processing along the first transportation path, while transporting the substrate along the first and second transportation paths in a second direction opposite to the first direction. This achieves bidirectional transportation of the substrates along the transportation path in the substrate treating apparatus.

Another embodiment of the present invention discloses a substrate transporting method for a substrate treating apparatus provided with n processing blocks arranged along an identical transportation path and performing an identical process to substrates, the n being a natural number of 2 or larger, an individual processing block of the n processing blocks having at least one processing unit performing a process set in advance to the substrates and a single substrate transport mechanism having arms holding the substrates The substrate transporting method performed by the substrate transport mechanism includes;

receiving n substrates of the received substrates from an upstream processing block using n arms of the n+1 arms provided with the substrate transport mechanism;

delivering one substrate of the n substrates to and from the processing unit in the processing block using one arm of the n arms holding the one substrate of the n substrates to be subjected to a given process by the processing block and one arm of the n arms holding no substrate;

keeping holding n−1 substrate or substrates of the n substrates using remaining n−1 arm or arms of the n arms with which the n substrates are received while the processing unit processes the one substrate; and transferring the n substrates to a downstream block using the one arm of the n arms holding the one substrate subjected to the given process by the processing block and the n−1 arms of the n arms holding the n−1 substrate or substrates.

Advantageous Effects of Invention

With the substrate transport apparatus and the substrate transporting method according to the embodiments of the present invention, the substrate transport mechanism delivers the substrate to and from the processing unit (i.e., replaces the substrate) in one of the processing blocks as usual while holding the n−1 substrate or substrates passing through the processing block using the n−1 arm or arms for performing processing in the processing block. Likewise, the substrate transport mechanism transports the substrate in an adjacent processing block to perform the same processing. This results in a reduced number of transportation steps. In addition, the processing blocks have substantially the same number of substrate transportation steps to the processing units. This causes substantially the same time for processing in the processing blocks. Accordingly, suppressing reduction in processing efficiency of parallel processing among the processing blocks is obtainable.

It is to be understood that both the foregoing general description and the following detailed description are exemplary and explanatory and are intended to provide further explanation of the invention as claimed.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIG. 7 is a left side view of the substrate treating apparatus according to the embodiment.

FIG. 8 is a perspective view of a main transport mechanism according to the embodiment.

FIGS. 16A to 16C, FIGS. 17A to 17C, and FIGS. 18A to 18D each illustrate operation of a main transport mechanism according to the other embodiment.

DESCRIPTION OF EMBODIMENTS

Figure 1:
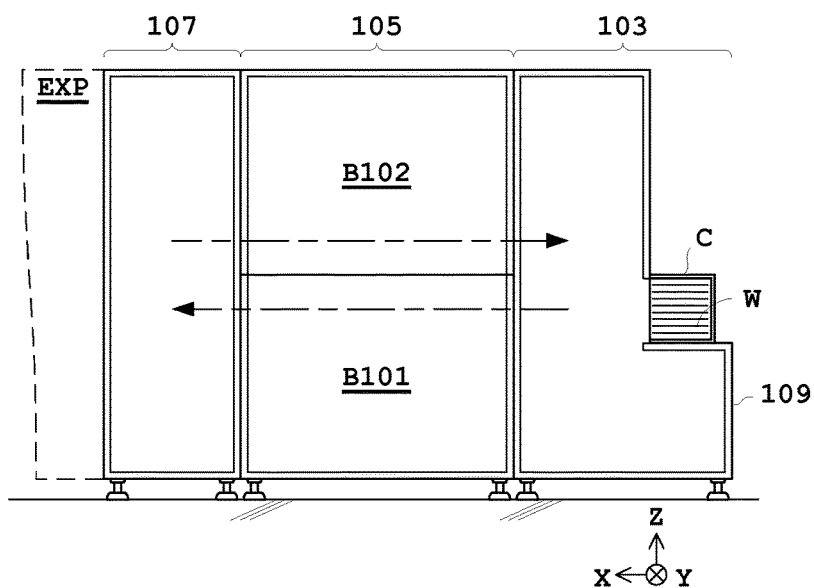
FIGS. 1 and 2 are side views each illustrating a currently-used substrate treating apparatus.
Figure 2:
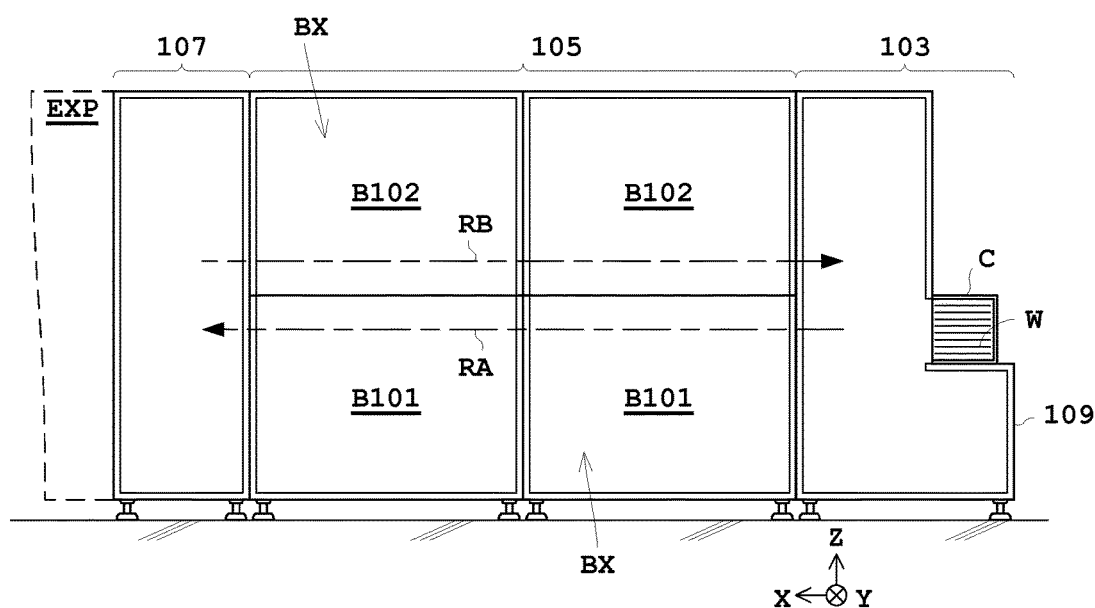

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

Embodiment 1

Figure 3:
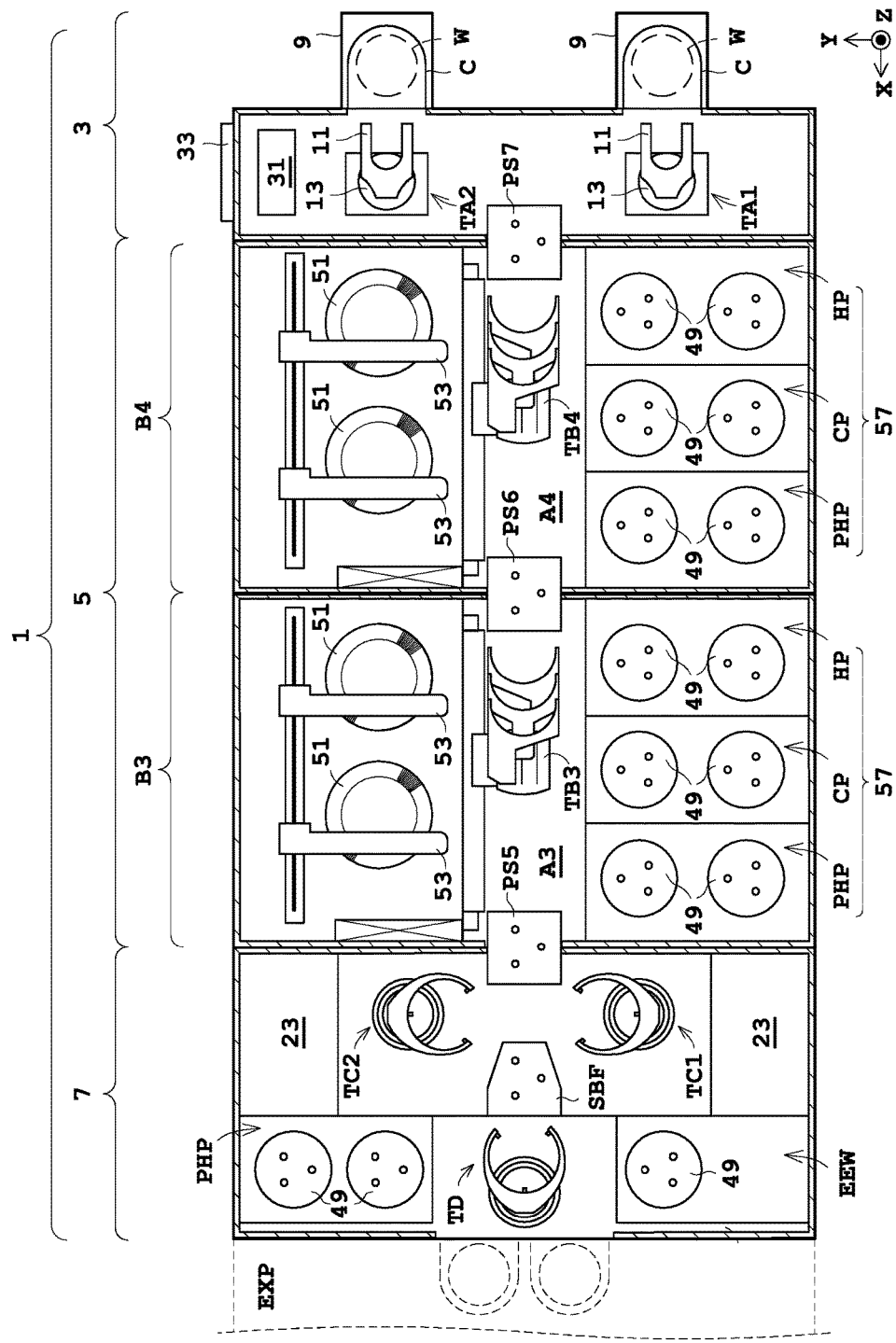
FIG. 3 is a plan view of a substrate treating apparatus and an upper processing block of a processor of the substrate treating apparatus according to one embodiment of the present invention.
Figure 4:
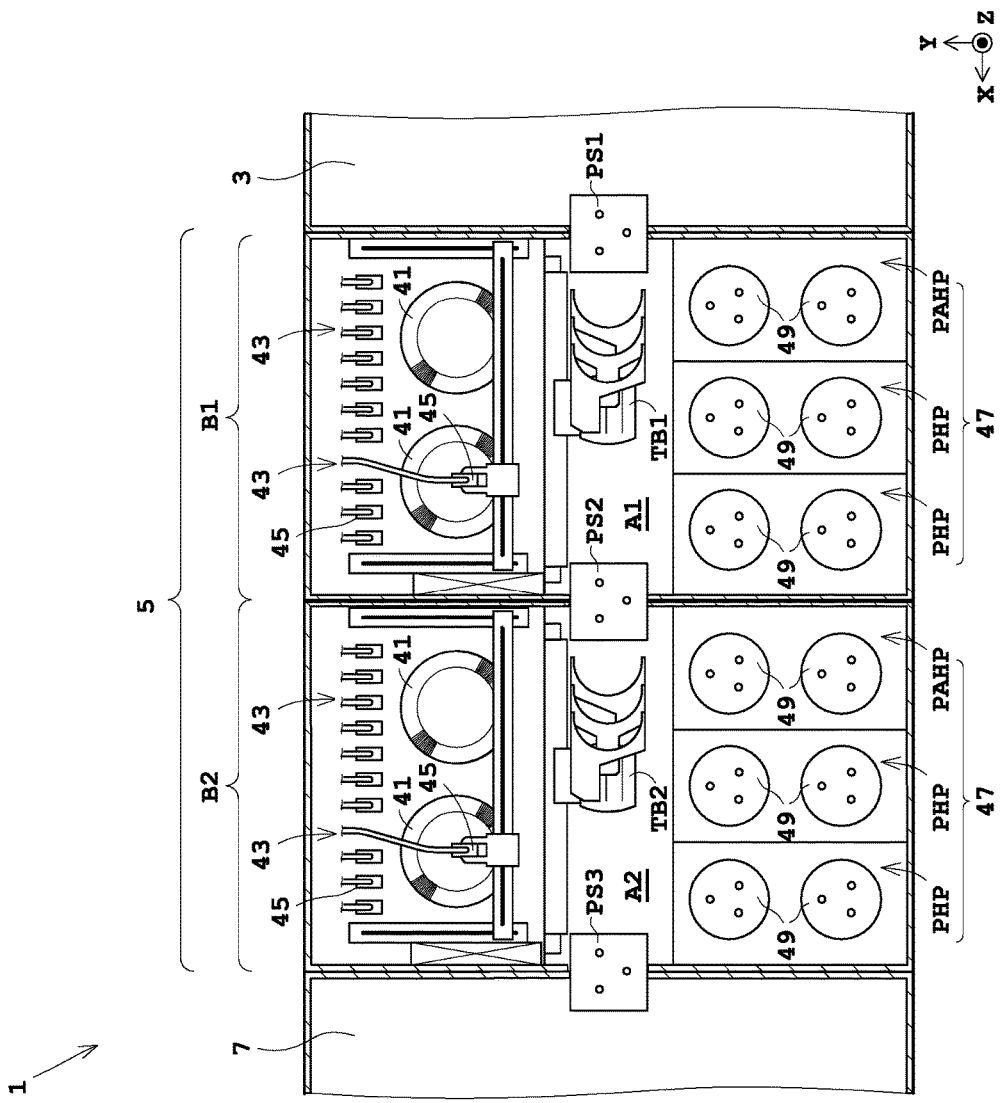
FIG. 4 is a plan view of a lower processing block of the processor.
Figure 5:
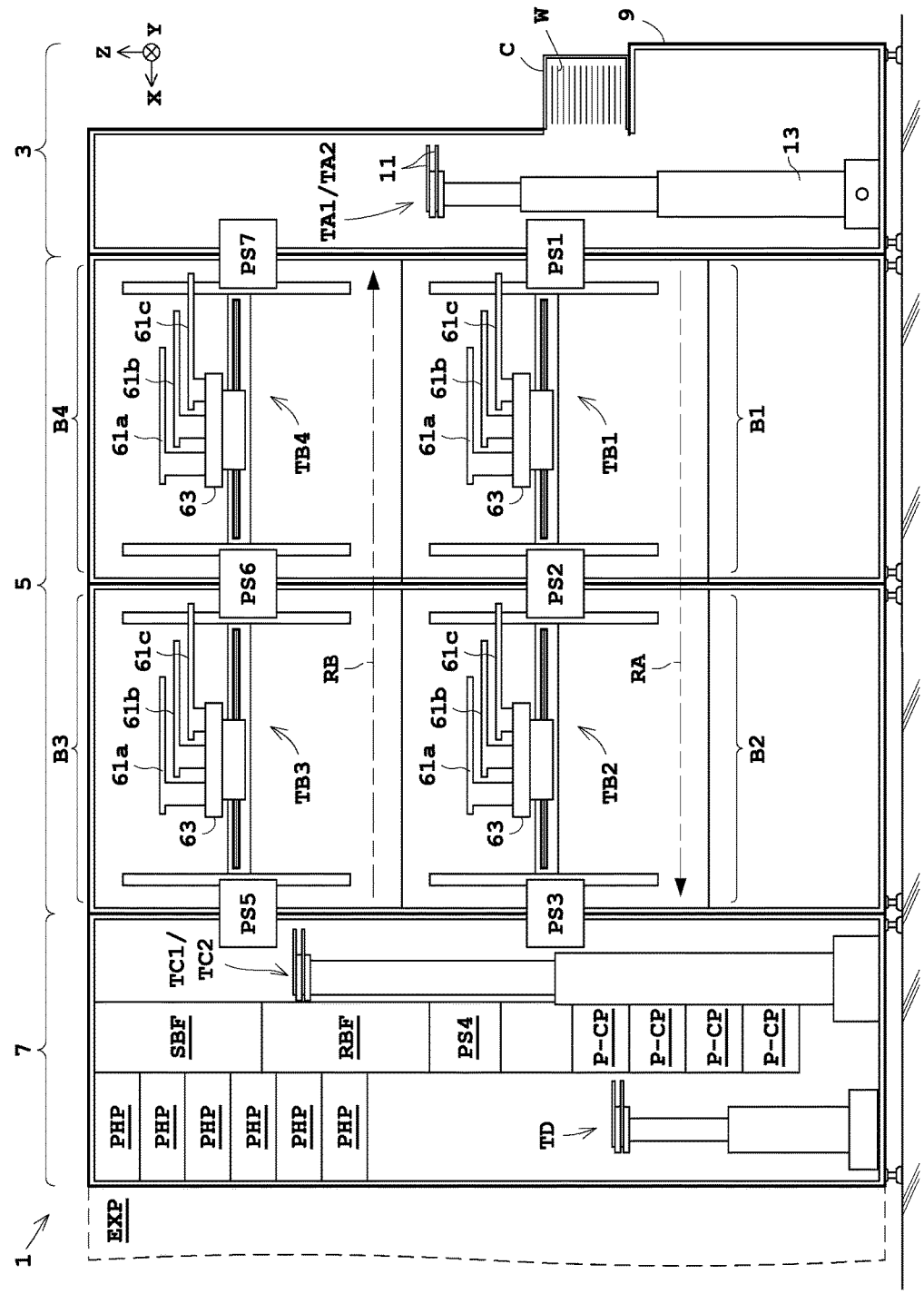
FIG. 5 is a vertical sectional view of the substrate treating apparatus according to the embodiment.

The following describes Embodiment 1 of the present invention with reference to drawings. FIG. 3 is a plan view of a substrate treating apparatus and an upper processing block of a processor of the substrate treating apparatus according to Embodiment 1. FIG. 4 is a plan view of a lower processing block of the processor. FIG. 5 is a vertical sectional view of the substrate treating apparatus according to Embodiment 1.

Reference is made to FIG. 3. A substrate treating apparatus 1 forms a resist film on a substrate (e.g., a semiconductor wafer) W, and develops an exposed substrate W. The substrate treating apparatus 1 includes an indexer (hereinafter, referred to as an "ID section") 3, a processor 5, and an interface (hereinafter, referred to as an "IF section") 7. The ID section 3, the processor 5, and the IF section 7 are arranged adjacently in this order. In addition, an exposing machine EXP as an external apparatus is provided adjacently to the IF section 7, the exposing machine EXP being separated from the apparatus 1. The following describes each construction of the above elements in order.

[ID Section 3]

Now reference is made to any of FIGS. 3 to 5. The ID section 3 includes carrier mount tables 9, and transport mechanisms TA1 and TA2 inside the ID section (hereinafter, referred to as a "transport mechanism" as appropriate). An individual carrier mount table 9 includes a carrier C accommodating a plurality of substrates (e.g., semiconductor wafers) W. Here, examples of the carrier C include a FOUP (front opening unified pod).

The transport mechanisms TA1 and TA2 each take the substrate W from the carrier C, transports the substrate W to a mount table PS1 illustrated in FIGS. 4 and 5, receives the substrate W from a mount table PS7 illustrated in FIGS. 3 and 5 to be mentioned later, and houses (returns) the substrate to the carrier C. The transport mechanisms TA1 and TA2 each include one or more holding arms 11, and a holding arm supporting table 13. The holding arm supporting table 13 moves the holding arms 11 vertically and horizontally and turns the holding arms 11 about a vertical (z-direction) axis. The two transport mechanisms TA1 and TA2 are arranged side by side in a width direction (Y-direction) of the substrate treating apparatus 1.

Here in FIG. 3, two carrier mount tables 9 are provided. Alternatively, one carrier mount table 9 or three or more carrier mount tables 9 may be provided. The number of transport mechanisms inside the ID section may be three or more. Alternatively, one transport mechanism may be so provided as to be movable in the width direction (Y-direction) of the substrate treating apparatus 1. The ID section 3 corresponds to the block in the present invention.

[Outline of Processor 5]

The processor 5 is formed by two layers in a vertical direction (Z-direction). Here, the processor 5 includes a total of four processing blocks B1 to B4. In FIG. 5, a lower layer includes two (n) processing blocks B1 and B2 arranged adjacently to each other along the same transportation path RA connecting the ID section 3 with the IF section 7. An upper layer includes two (n) processing blocks B3 and B4 arranged adjacently to each other along the same transportation path RB connecting the ID section 3 with the IF section 7. The n indicates a natural number. The processing blocks B1 to B4 corresponds to the blocks in the present invention. The transportation path RA corresponds to the first transportation path in the present invention. The transportation path RB corresponds to the second transportation path in the present invention. Here, the transportation path RB may correspond to the first transportation path in the present invention, whereas the transportation path RA may correspond to the second transportation path in the present invention.

The processor 5 performs processing for at least one process to be performed in predetermined orders. Specifically, the processor 5 performs application processing to form a coating film on the substrate W, and performs developing processing to develop the substrate W. That is, the application processing is performed in the two processing blocks B1 and B2 in FIG. 4, and the developing processing is performed in the two processing blocks B3 and B4 in FIG. 3.

The processing blocks B1 to B4 each include at least one processing unit U for performing processing set in advance to the substrate W, and single main transport mechanism TB1 to TB4, respectively, each with three (n+1) arms for holding the substrate W. That is, the processor 5 formed by the four processing blocks B1 to B4 includes a total of four main transport mechanisms TB1 to TB4. Here, the main transport mechanisms TB1 to TB4 correspond to the substrate transport mechanism in the present invention.

The present invention has a characteristic concerning to substrate transportation in the processing blocks B1 to B4. For instance, the two processing blocks B1 and B2 for performing the application processing are arranged along the transportation path RA. The main transport mechanism TB1 delivers a substrate W to and from each of the processing units U (replaces a substrate W) while holding a substrate W to be processed in the processing block B2. On the other hand, the main transport mechanism TB2 delivers another substrate W to and from each of the processing units U (replaces a substrate W) while holding the substrate W already processed in the processing block B1. Consequently, the processing blocks B1 and B2 can obtain substantially the same number of substrate W transportation steps to each of the processing units U. Accordingly, the processing blocks B1 and B2 obtain substantially the same time for processing.

This achieves suppressing reduction in processing efficiency of the parallel processing among the processing blocks. The processor 5 is to be described later in detail.

[IF Section 7]

The IF section 7 transports the substrate W from the processor 5 to an exposing machine EXP as an external apparatus. Moreover, the IF section 7 returns the substrate W exposed by the exposing machine EXP to the processor 5. The IF section 7 includes a first transport mechanism adjacent to the processor (hereinafter, referred to as a "transport mechanism" as appropriate) TC1, a second transport mechanism adjacent to the processor (hereinafter, referred to as a "transport mechanism" as appropriate) TC2, and a single transport mechanism adjacent to the exposing machine (hereinafter, referred to as a "transport mechanism" as appropriate) TD. The transport mechanisms TC1, TC2, and TD are configured in the same manner as the transport mechanisms TA1 and TA2.

The IF section 7 further includes at least one processing unit U, a mounting-cum-cooling unit PASS-CP performing either transfer or receipt of the substrate W to or form the exposing machine EXP, a mount table PS4, a feed buffer SBF, and a return buffer RBF. The processing unit U includes an edge exposure unit EEW exposing a periphery of the substrate W, and a heating-cooling unit PHP performing heating and cooling successively. See FIGS. 5 to 7.

The single edge exposure unit EEW includes a rotation holder (not shown) rotatably holding the substrate W, and a light irradiator (not shown) exposing the periphery of the substrate W held with the rotation holder. The heating-cooling units PHP each perform heating to the exposed substrate W after exposure (PEB: Post Exposure Bake). The IF section 7 may further includes a pre-exposure cleaning unit 21 cleaning and drying the substrate W prior to the exposure, and a post-exposure cleaning unit 23 cleaning and drying the processed substrate W when the exposing machine EXP adopting an immersion method is used.

The mounting-cum-cooling unit PASS-CP, the mount table PS4, the feed buffer SBF, and the return buffer RBF are so configured as to place one or more substrates W. Moreover, one or more edge exposure units EEW, heating-cooling units PHP, pre-exposure cleaning units 21, and post-exposure cleaning units 23 are provided. Moreover, the edge exposure unit EEW may be provided in each of the two processing blocks B3 and B4 of the processor 5. The types and arrangement of each processing unit U are not limited to the constructions in FIGS. 3 and 5, and may be set as appropriate. Here, the IF section 7 corresponds to the block in the present invention.

[Construction of Control System]

The substrate treating apparatus 1 includes a main controller 31 and an input-output unit 33. For instance, as illustrated in FIG. 3, the main controller 31 and the input-output unit 33 are arranged in the ID section 3. The main controller 31 controls en bloc each element of the ID section 3, the processor 5, and the IF section 7. The main controller 31 includes a CPU. Specifically, the main controller 31 controls each operation of the transport mechanisms TB1 to TB4 and various processing units U.

The input-output unit 33 is attached on a side wall of the ID section 3. The input-output unit 33 displays transportation conditions and processing conditions of the substrates W in the substrate treating apparatus 1. Moreover, a user allows input of commands into the input-output unit 33, the commands concerning display on the input-output unit 33 and concerning operation of the transport mechanisms TB1 to TB4 as well as various processing units U.

[Details of Processor 5]

The following describes a detailed construction of the processor 5. As illustrated in FIGS. 3 to 5, the processor 5 includes the four processing blocks B1 to B4. The processor 5 includes an upper layer in which the two processing blocks B1 and B2 are arranged along the same transportation path RA, and a lower layer in which the two processing blocks B3 and B4 are arranged along the same transportation path RB. The processing blocks B1 to B4 each include at least one processing unit U (indicated by numerals PHP, CP, and HP, for example). Moreover, the processing blocks B1 to B4 includes main transport mechanisms TB1 to TB4, respectively. For instance, as illustrated in FIG. 3, the processing block B3 includes a plurality of processing units U and a single main transport mechanism TB3. Likewise, the processing block B4 includes a plurality of processing units U and a single main transport mechanism TB4.

The processing blocks B1 to B4 include transportation spaces A1 to A4, respectively, for transporting the substrate W between the ID section 3 and the IF section 7 with the main transport mechanisms TB1 to TB4, respectively. The transportation spaces A1 to A4 each have the processing units U on both sides thereof.

Figure 6:
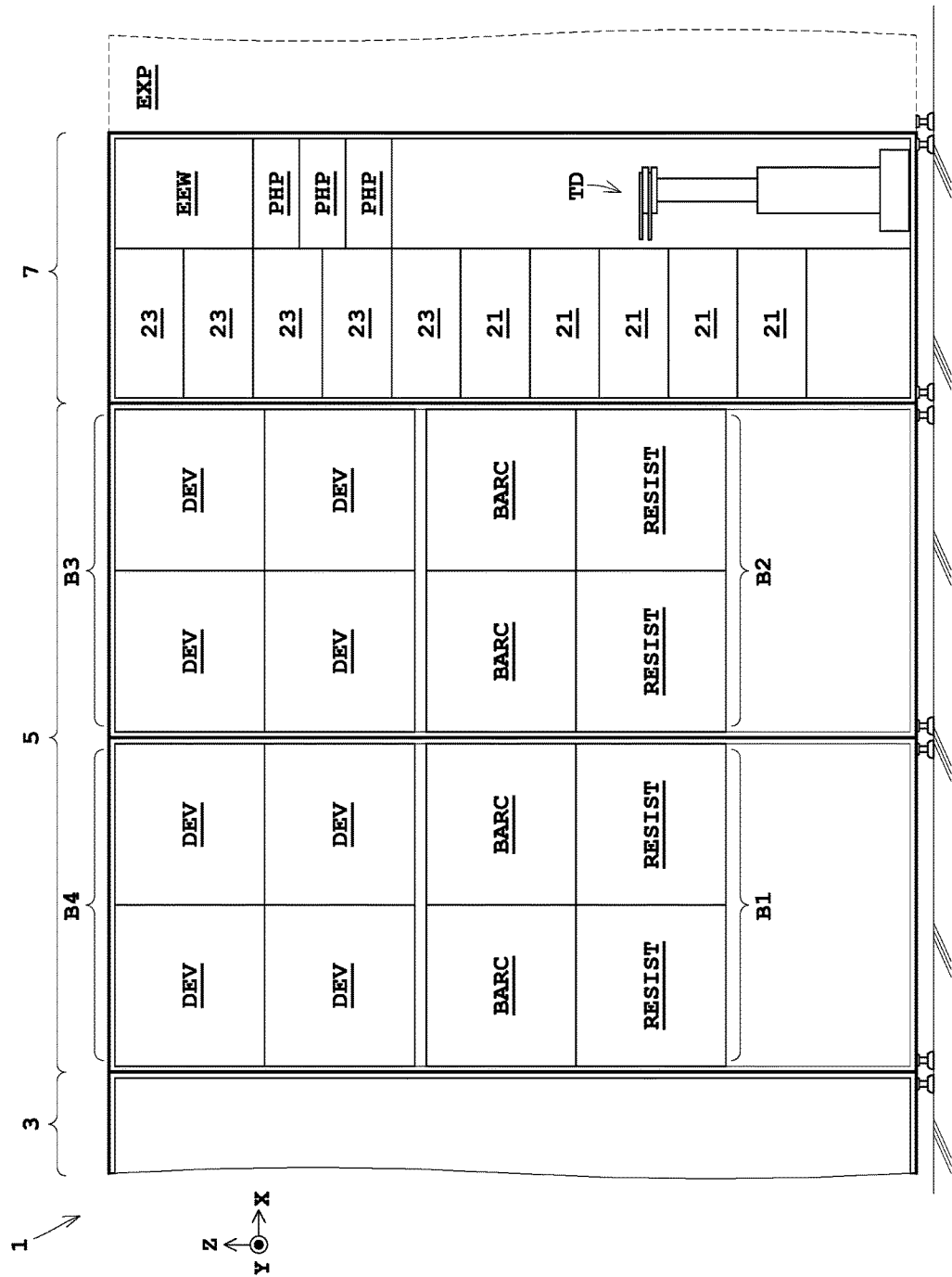
FIG. 6 is a right side view of the substrate treating apparatus according to the embodiment.

The following describes the processing unit U in each of the processing blocks B1 to B4. Regarding a view from the carrier C in FIG. 3 as a front view, FIG. 6 is a right side view of the substrate treating apparatus 1, and FIG. 7 is a left side view of the substrate treating apparatus 1. In other words, FIG. 6 illustrates one side of the processing units U and FIG. 7 illustrates the other side of the processing units U across the transportation spaces A1 to A4.

<Processing Unit U of Processing Block B1 and B2>

As illustrated in FIG. 6, the two processing blocks B1 and B2 each include an antireflection-film application processing units BARC each forming an antireflection film on the substrate W, and resist-film application processing units RESIST each forming a resist film on the substrate W. The application processing units BARC and RESIST are each arranged in 2 by 2, i.e., two in the horizontal direction and two in the vertical direction.

As illustrated in FIG. 4, the application processing units BARC and RESIST each include a rotation holder 41 rotatably holding the substrate W, and a feeder 43 feeding a processing liquid (e.g., a resist liquid) to the substrate W. The feeder 43 selects one of a plurality of nozzle 45. The feeder 43 is movable between a standby position of the nozzle 45 and a processing position above the substrate W.

Moreover, the two processing blocks B1 and B2 each further include heat treating units 47 each performing a heat treatment to the substrate W. As illustrated in FIG. 7, the heat treating units 47 each include cooling units CP cooling the substrate W, heating-cooling units PHP heating and cooling the substrate W successively, and adhesion reinforcement processing units PAHP. The adhesion reinforcement processing units PAHP each apply an adhesion reinforcement agent, such as hexamethyldisilazane (HMDS), to the substrate W and thereafter heating the substrate W, thereby enhancing adhesion between the substrate W and the antireflection film. The heat treating units 47 are arranged in 3 by 5, i.e., three in the horizontal direction and five in the vertical direction. Moreover, the heat treating units 47 each include a plate 49 placing the substrate W thereon.

<Processing Unit U of Processing Block B3 and B4>

As illustrated in FIG. 6, the two processing blocks B3 and B4 each include developing units DEV developing the substrate W. The developing process units DEV are arranged in 2 by 2, i.e., two in the horizontal direction and two in the vertical direction. As illustrated in FIG. 3, the developing process units DEV each further include a rotation holder 51 rotatably holding the substrate W and a feeder 53 feeding a developer.

The two processing blocks B3 and B4 each further include a heat treating unit 57 for heat treating to the substrate W. As illustrated in FIG. 7, the heat treating units 57 each include heating units HP heating the substrate W, cooling units CP cooling the substrate W, and heating-cooling units PHP. The heat treating units 57 are arranged in 3 by 5, i.e., three in the horizontal direction and five in the vertical direction.

Here, the type and arrangement of various processing units U in the processing blocks B1 and B4 are not limited to the constructions in FIGS. 6 and 7, but are set as appropriate.

<Construction for Transporting Substrate W>

The following describes a construction for transporting the substrate W in the processor 5. In this embodiment, likewise the transportation along two transportation paths RA and RB in FIG. 5, the substrate W is transported from the processing block B1 to the processing block B2, or from the processing block B3 to the processing block B4.

The substrate W is subjected to either transfer or receipt through the mount tables PS1 to PS3, and PS5 to PS7. Specifically, the substrate W is transferred or received between the ID section 3 and the processing blocks B1 and B4, between the processing blocks B1 and B2, between the processing blocks B3 and B4, and between the processing blocks B2 and B3 and the IF section 7 through the mount tables PS1 to PS3, PS5 to PS7. For instance, the substrate W is transferred or received between the ID section 3 and the processing block B1 through the mount table PS1, and between the processing blocks B1 and B2 through the mount table PS2.

The mount tables PS1 to PS3 and PS5 to PS7 can each place three (n+1) substrates thereon and simultaneously transfer or receive the substrates W using three arms 61a to 61c to be mentioned later. The mount tables PS1 to PS7 each include a sensor (not shown) for detecting whether or not the substrate W is placed thereon. The main transport mechanisms TB1 to TB4 each perform either transfer or receipt of the substrates W in accordance with signals from the sensor. The mount tables PS1 and PS5 may place two (n) substrates W thereon.

The main transport mechanisms TB1 to TB4 transport the substrates W in the processing blocks B1 to B4, respectively. The main transport mechanisms TB1 to TB4 is so configured to transport the substrates W in the processing blocks B1 to B4 using the main transport mechanisms TB1 to TB4, respectively. The main transport mechanisms TB1 to TB4 can deliver all the substrates W between all the processing units U in the processing blocks B1 to B4 provided with the main transport mechanisms TB1 to TB4, respectively.

Now the main transport mechanisms TB1 to TB4 are to be described. Since the four main transport mechanisms TB1 to TB4 have almost the same constructions, the following describes the main transport mechanism TB1 as one example. FIG. 8 is a perspective view of the main transport mechanisms TB1 to TB4.

The main transport mechanism TB1 includes three arms 61a to 61c holding the substrates W, an arm holder 63 movably holding the three arms 61a to 61c in the same horizontal direction, and a base 65 rotatably supporting the arm holder 63 around a vertical axis Q (about a Z-direction). The main transport mechanism TB1 further includes a first guide rail 67 guiding the base vertically, and a second guide rail 69 guiding the base horizontally along the transportation path RA. Accordingly, the first and second guide rails 67 and 69 move the base 65 two-dimensionally. A drive mechanism (not shown), such as a motor, moves the three arms 61a to 61c horizontally, rotates the arm holder 63, and moves the base 65 two-dimensionally.

The following describes the three arms 61a to 61c of the main transport mechanism TB1. The three arms 61a to 61c are movable individually so as not to interfere with movement thereof when the substrates W are received and transferred. For instance, the arm 61a moves in the same direction as the other arms 61b and 61c so as for the other arms 61b and 61c not to interfere with movement of the arm 61a. Moreover, it is natural to move only one arm for transferring or receiving the substrate W to or from the mount table PS5. In addition, it is possible to move two or three arms for transferring or receiving the substrates W simultaneously. Here, as described next in FIG. 9, the main transport mechanism TB1 uses two of the three arms 61a to 61c to receive two substrates W simultaneously from the mount table PS1.

Figure 9A:
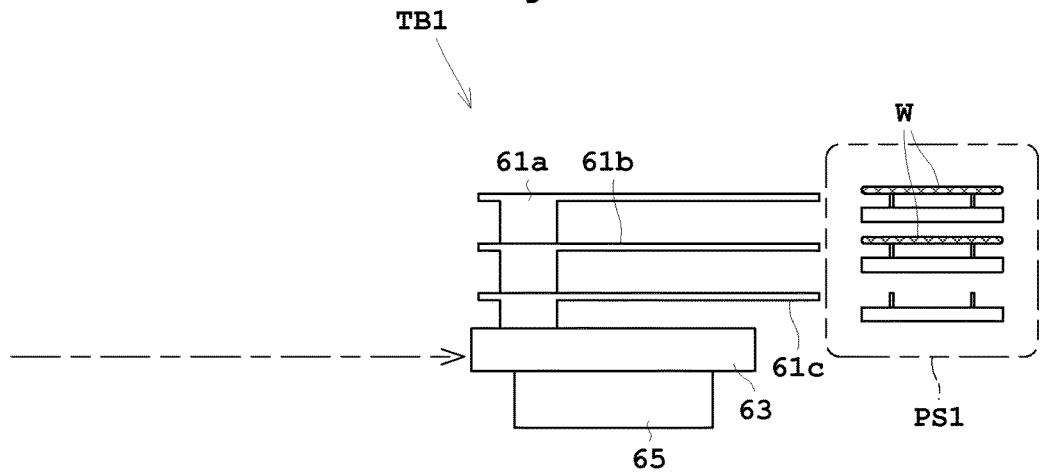
FIGS. 9A to 9C each illustrate one example of substrate transportation by the main transport mechanism to a mount table.
Figure 9B:
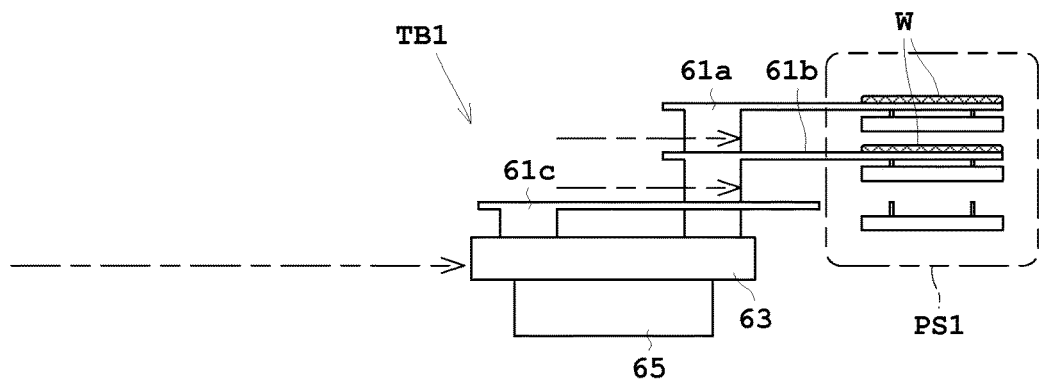
Figure 9C:
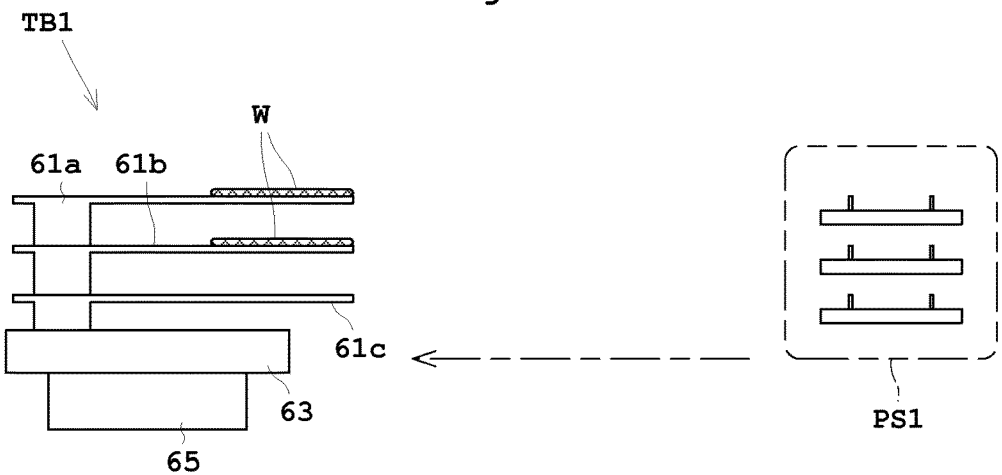

FIGS. 9A to 9C each illustrate operation of the main transport mechanism TB1 transporting the substrates W to the mount table PS1. FIG. 9A illustrates the arms 61a to 61c prior to receipt of two substrates W. FIG. 9B illustrates the arms in the process of receiving the two substrates W. FIG. 9C illustrates the arms after the receipt of the two substrates W.

As illustrated in FIG. 9A, the main transport mechanism TB1 moves the arm holder 63 adjacent to the mount table PS1. As illustrated in FIG. 9B, the main transport mechanism TB1 moves two of the three arms 61a to 61c, e.g., upper two arms 61a and 61b, horizontally to receive the two substrates W placed on the mount table PS1 simultaneously. Then, as illustrated in FIG. 9C, the main transport mechanism TB1 moves the two arms 61a and 61b horizontally to return them to their original positions and moves the arm holder 63 to the processing unit U.

Figure 10A:
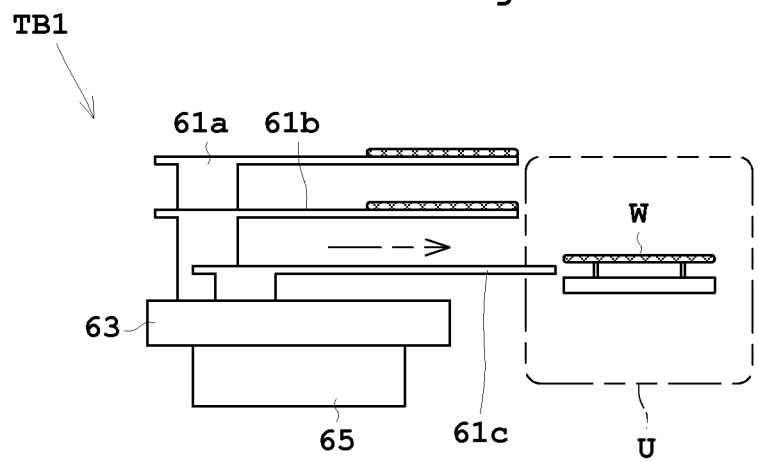
FIGS. 10A and 10B illustrates one example of substrate reception and transfer by the main transport mechanism to an individual processing unit (replacing the substrate).
Figure 10B:
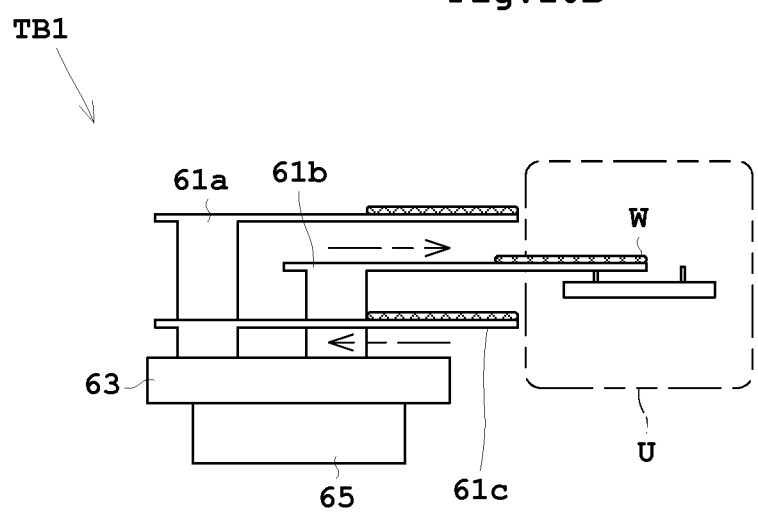

FIGS. 10A and 10B illustrate one example of delivering the substrates between an individual processing unit (replacing the substrate) with the main transport mechanism TB1. As illustrated in FIG. 1 OA, the main transport mechanism TB1 firstly receives a cooled substrate W in the processing unit U using the arm 61c of the three arms 61a to 61c holding no substrate W. Thereafter, as illustrated in FIG. 10B, the main transport mechanism TB1 transfers the substrate W to be subjected to the application process in the processing block B1 to the processing unit U using one of the two arms holding the substrates W.

In the above description, the lower processing blocks B1 and B2 are provided for the application processing, and the upper processing blocks B3 and B4 are provided for the developing processing. Alternatively, the converse is adoptable. That is, the upper processing blocks B3 and B4 may be provided for the application processing, and the lower processing blocks B1 and B2 may be provided for the developing processing.

Moreover, in the above description, the two processing block B1 and B2 and the two processing blocks B3 and B4 are laminated vertically. Alternatively, the two processing block B1 and B2 and the two processing blocks B3 and B4 may be arranged in parallel so as for the two transportation paths RA and RB to be in the horizontal direction (Y-direction). Moreover, three or more processing blocks may be laminated vertically.

[Operation of Substrate Treating Apparatus]

Figure 12A:
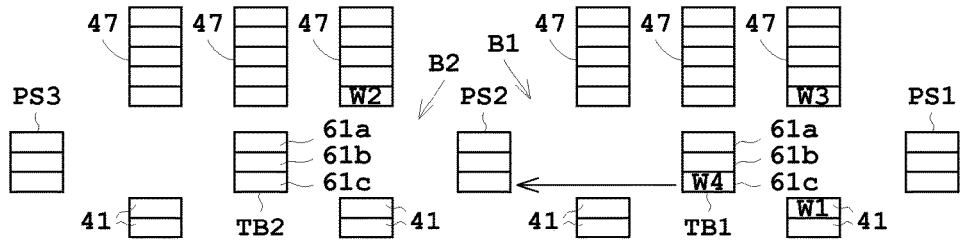

The following describes operation of the substrate treating apparatus 1 according to the embodiment of the present invention. FIGS. 11A to 11F (hereinafter, referred to as "FIG. 11" as appropriate), FIGS. 12A to 12F (hereinafter, referred to as "FIG. 12" as appropriate), and FIGS. 13A to 13D (hereinafter, referred to as "FIG. 13" as appropriate) each illustrate operation of the main transport mechanisms TB1 to TB4. FIG. 12A is illustrated followed by FIG. 11F, and FIG. 13A is illustrated followed by FIG. 12F. FIG. 14 is a flow chart of the operation of the substrate treating apparatus 1.

To simplify the illustration of transporting the substrates in FIGS. 11 to 13, the substrates W are transported to two of the processing units U illustrated as the heat treating unit 47 and the rotation holder 41. However, in one embodiment illustrated in FIG. 14, the substrates W are transported to seven processing units U in a processing block B1 in Step S02 and a processing block B2 in Step S04. This case is illustrated by FIG. 13D, for example. FIG. 13D illustrates mount tables PS1 to PS3 and main transport mechanisms TB1 and TB2 each holding two substrates W, and processing blocks B1 and B2 each holding one substrate W in seven processing units. Moreover, as illustrated in FIG. 14, substrates W are transported to four processing unit U in order in a processing block B3 in Step S08 and a processing block B4 in Step S10. FIGS. 11 to 13 include numerals W1, W2 and the like each indicating a number of the substrate W transported in order to the mount table PS1 and the like. The substrate is indicated as the "substrate W" when no distinguish is made to the number given to the substrate W.

Firstly, the following describes operation of the two main transport mechanisms TB1 and TB2 with reference to FIGS. 11 to 13. Since operation of two main transport mechanisms TB3 and TB4 is identical to operation of the main transport mechanisms TB1 and TB2, the description thereof is to be omitted.

Figure 11A:
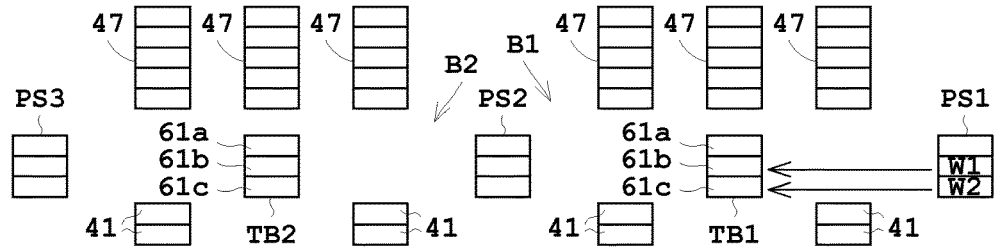
FIGS. 11A to 11F, FIGS. 12A to 12F, and FIGS. 13A to 13D each illustrate operation of the main transport mechanism.

In FIG. 11A, the mount table PS1 contains two substrates W1 and W2 transported with the transport mechanism TA1 in the ID section 3. The main transport mechanism TB1 in the processing block B1 receives two (n) substrates W1 and W2 from the upstream ID section 3 via the mount table PS1 simultaneously with lower two (n) arms 61b and 61c among three (n+1) arms 61a to 61c. That is, the main transport mechanism TB1 receives the two substrates W1 and W2 from the mount table PS1 simultaneously. At this time, an arm holder 63 of the main transport mechanism TB1 (see FIG. 5) is located adjacent to the upstream ID section 3 (adjacent to the mount table PS1) upstream of the downstream processing block B2 along the transportation path RA.

Figure 11B:
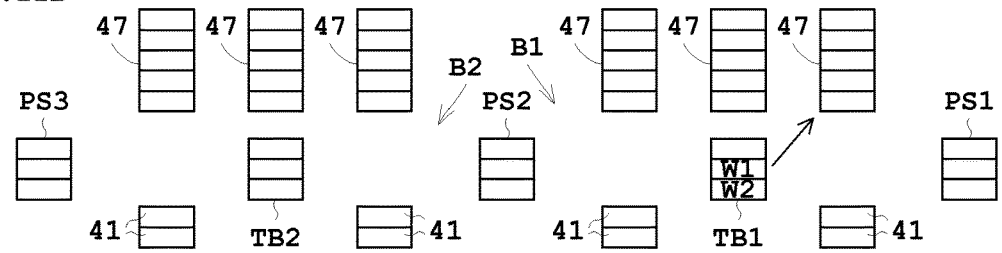

In FIG. 11B, one substrate W1 of the received two substrates W1 and W2 is processed in the processing block B1. The other one (n-1) substrate W2 is held with the arm 61c, for example, for processing in the next processing block B2. The main transport mechanism TB1 delivers (replaces) the substrate W to and from the processing unit U in the processing block B1 using one arm 61b and one arm 61a, the arm 61b holding one substrate W1 of the received two (n) substrates W1 and W2 to be processed in the processing block B1, and the arm 61a holding no substrate W.

In FIG. 11B, the main transport mechanism TB1 only transfers the substrate W1 to the processing unit U (heat treating unit 47) since the processing unit U (heat treating unit 47) contains no substrate W. Accordingly, delivering the substrate W includes at least either transferring the substrate W or receiving the substrate W.

Figure 11C:
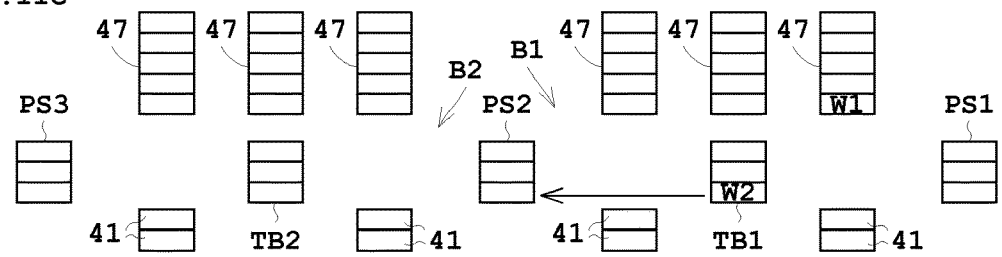

In FIG. 11C, the main transport mechanism TB1 transfers the substrate W2 via the mount table PS2 to the downstream processing block B2 using the arm 61c before completion of processing the substrate W in the processing unit U. That is, the main transport mechanism TB1 transports the substrate W2 to the mount table PS2. At this time, the arm holder 63 of the main transport mechanism TB1 is located adjacent to the processing block B2 (adjacent to the mount table PS2) downstream of the upstream ID section 3 along the transportation path RA.

Figure 11D:
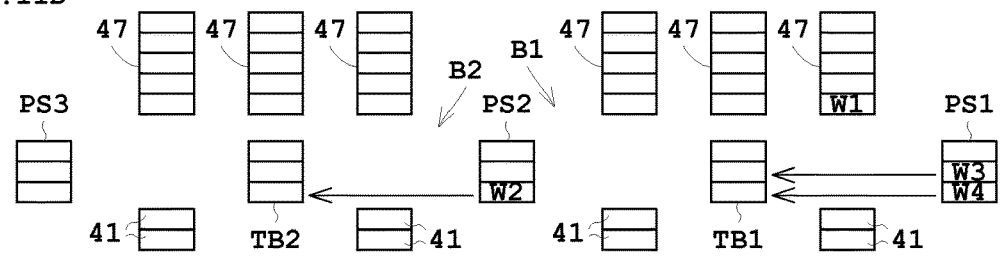

In FIG. 11D, the mount table PS1 contains other two substrates W3 and W4 transported by the transport mechanism TA1 of the ID section 3. Like the construction in FIG. 11A, the main transport mechanism TB1 in the processing block B1 receives the two substrates W3 and W4 from the mount table PS1 with two arms 61b and 61c simultaneously.

The main transport mechanism TB2 in the processing block B2 receives the substrate W2 from the mount table PS2 with the arm 61c. At this time, an arm holder 63 of the main transport mechanism TB2 (see FIG. 5) is located adjacent to the upstream processing block B1 (adjacent to the mount table PS2) along the transportation path RA. Here, there is no need to synchronize the receipt of the substrate W2 by the main transport mechanism TB2 with the receipt of the substrates W3 and W4 by the main transport mechanism TB1. In other words, the main transport mechanism TB2 may receive the substrate W2 immediately after the substrate W2 is transported to the mount table PS2 so as for the main transport mechanism TB1 not to interfere with the arms 61a to 61c. Consequently, the substrate W2 can be transported to the processing unit U rapidly.

Figure 11E:
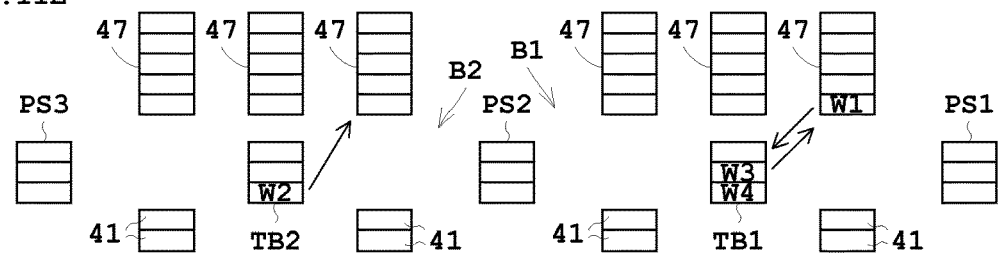
Figure 11F:
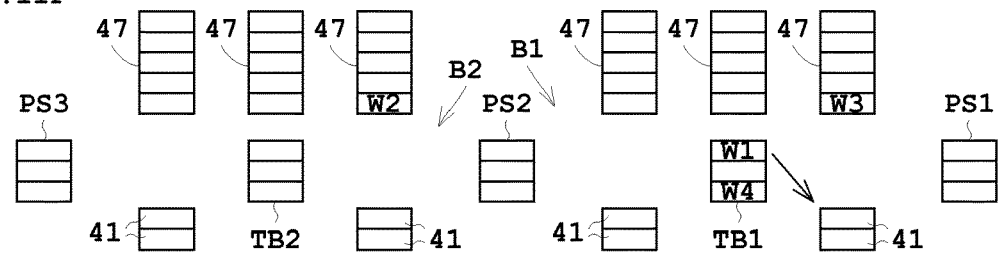

In FIG. 11E, the main transport mechanism TB1 in the processing block B1 delivers the substrate W to the processing unit U in the processing block B1 using the arm 61b and the arm 61a, the arm 61b holding one substrate W3 of the received two (n) substrates W3 and W4 to be processed in the processing block B1, and the arm 61a holding no substrate W. That is, the main transport mechanism TB1 delivers the substrates W1 and W3 to and from the processing unit U using the two arms arm 61a and 61b.

The main transport mechanism TB2 of the processing block B2 transfers the substrate W2 to the processing unit U (heat treating unit 47).

In FIG. 11F, the main transport mechanism TB1 of the processing block B1 delivers the substrate W to and from the processing unit U in the processing block B1 using the arm 61a and the arm 61b, the arm 61a holding one substrate W4 of the received two (n) substrates W4 and W4 to be processed in the processing block B1, and the arm 61b holding no substrate W. In FIG. 11F, since the processing unit U (rotation holder 41) contains no substrate W, the main transport mechanism TB1 transfers only the substrate W1 to the processing unit U (rotation holder 41).

In FIG. 12A, like the construction in FIG. 11C, the main transport mechanism TB1 in the processing block B1 transfers the substrate W4 via the mount table PS2 to the downstream processing block B2 using the arm 61c before the processing unit U completes processing to the substrate W1. That is, the main transport mechanism TB1 transports the substrate W4 to the mount table PS2.

Figure 12B:
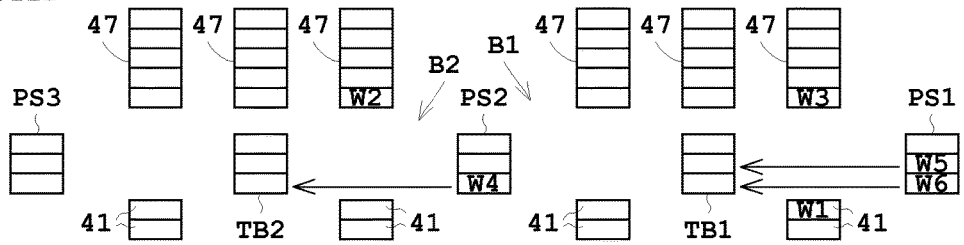
Figure 13A:
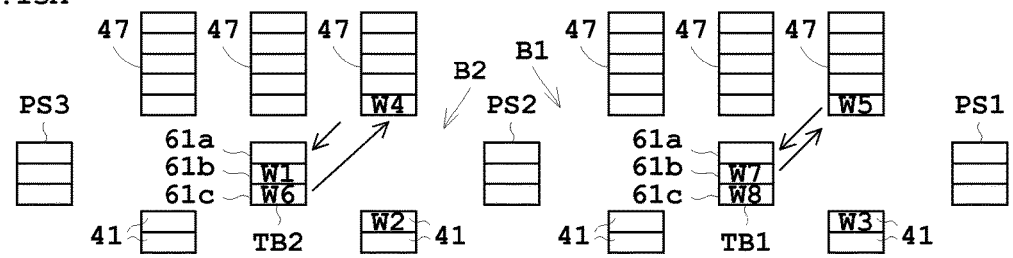

In FIG. 12B, the mount table PS1 contains other two substrates W5 and W6 transported by the transport mechanism TA1 in the ID section 3. Like the construction in FIG. 11A, the main transport mechanism TB1 in the processing block B1 receives the substrates W5 and W6 simultaneously from the mount table PS1 simultaneously.

Like the construction in FIG. 11D, the main transport mechanism TB2 of the processing block B2 receives the substrate W4 from the mount table PS2 using one arm 61c.

Figure 12C:
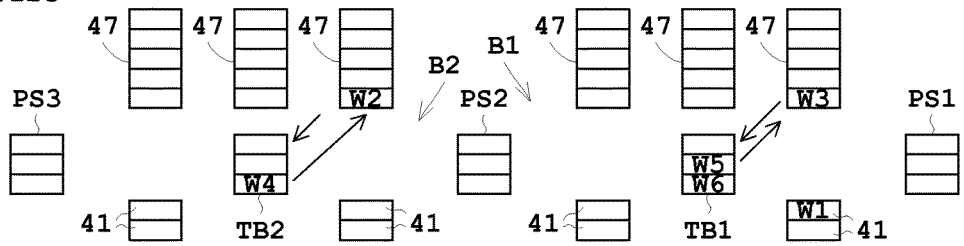

In FIG. 12C, like the construction in FIG. 11E, the main transport mechanism TB1 of the processing block B1 delivers the substrates W to and from the processing unit U in the processing block B1 using the arm 61b and the arm 61a, the arm 61b holding one substrate W5 of the received two (n) substrates W5 and W6 to be processed in the processing block B1, and the arm 61a holding no substrate W. That is, the main transport mechanism TB1 delivers the substrates W3 and W5 to and from the processing unit U using the two arms arm 61a and 61b.

The main transport mechanism TB2 of the processing block B2 delivers the substrates W to and from the processing unit U of the processing block B2 using the arm 61c holding the substrate W4 to be processed in the processing block B2 and the arm 61a holding no substrate W. That is, the main transport mechanism TB2 delivers the substrates W2 and W4 to and from the processing unit U using the arms 61a and 61c.

Figure 12D:
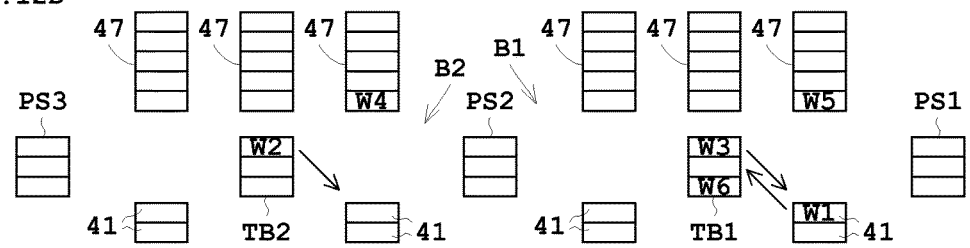

In FIG. 12D, the main transport mechanism TB1 in the processing block B1 delivers the substrates W to the processing unit U in the processing block B1 using the arm 61a and the arm 61b, the arm 61a holding one substrate W3 of the received two (n) substrates W3 and W6 to be processed in the processing block B1, and the arm 61b holding no substrate W. That is, the main transport mechanism TB1 delivers the substrates W1 and W3 to and from the processing unit U using the two arms arm 61a and 61b. Here in FIGS. 12C and 12D, the arm 61c of the main transport mechanism TB1 keeps holding the substrate W6.

The main transport mechanism TB2 of the processing block B2 delivers the substrate W to and from the processing unit U in the processing block B2 using the arm 61a holding one substrate W2 to be processed in the processing block B2, and the arm 61c holding no substrate W. In FIG. 12D, since the processing unit U (rotation holder 41) contains no substrate W, the main transport mechanism TB2 transfers only the substrate W2 to the processing unit U (rotation holder 41).

Figure 12E:
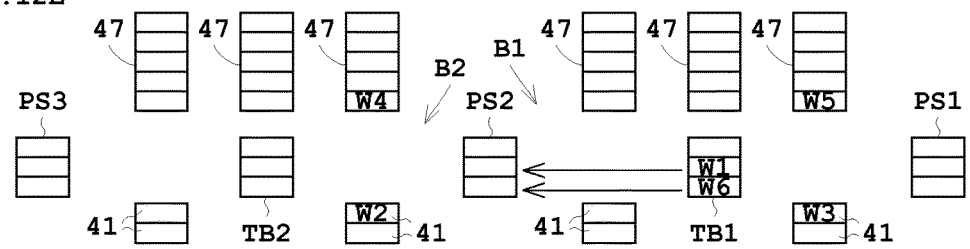

In FIG. 12E, the main transport mechanism TB1 of the processing block B1 transfers the two substrates W1 and W6 simultaneously via the mount table PS2 to the downstream processing block B2 using the arms 61b and 61c, the arm 61b holding the substrate W1 subjected to a given (preset) process in the processing block B1, and the one (n–1) arm 61c holding one (n–1) substrate W6. That is, the main transport mechanism TB1 transports the two substrates W1 and W6 simultaneously to the mount table PS2. At this time, the arm holder 63 in the main transport mechanism TB1 (see FIG. 5) is located adjacent to the downstream processing block B2 (adjacent to the mount table PS2) along the transportation path RA.

Figure 12F:
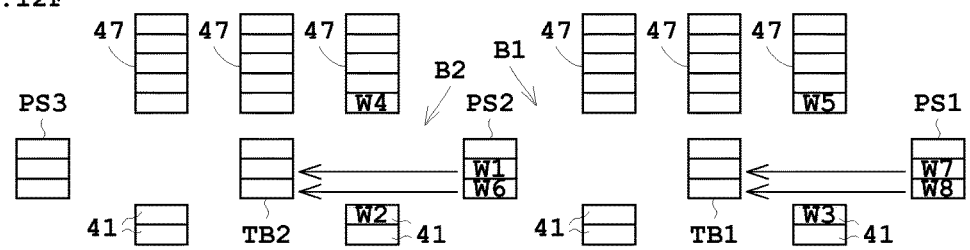

In FIG. 12F, the mount table PS1 contains other two substrates W7 and W8 transported by the transport mechanism TA1 in ID section 3. Likewise the construction in FIG. 11A, the main transport mechanism TB1 of the processing block B1 receives the two substrates W7 and W8 simultaneously from the mount table PS1.

The mount table PS2 contains the transported two substrates W1 and W6. The main transport mechanism TB2 of the processing block B2 receives the two substrates W1 and W6 simultaneously via the mount table PS2 from the upstream processing block B1 using the two arms 61b and 61c of the three arms 61a to 61c. That is, the main transport mechanism TB2 receives the two substrates W1 and W6 simultaneously from the mount table PS2. At this time, the arm holder 63 of the main transport mechanism TB2 is located adjacent to the upstream processing block B1 (adjacent to the mount table PS2) along the transportation path RA.

In FIG. 13A, likewise the construction in FIG. 11E, the main transport mechanism TB1 in the processing block B1 delivers the substrates W to the processing unit U in the processing block B1 using the arms 61b and 61a, the arm 61b holding the substrate W7 of the two received substrates W7 and W8 to be processed in the processing block B1, and the arm 61 holding no substrate W. That is, the main transport mechanism TB1 delivers the substrates W5 and W7 to and from the processing unit U using the two arms 61a and 61b.

The substrate W6 of the received two substrates W1 and W6 is processed in the processing block B2. The other one (n−1) substrate W1 is held with the arm 61b for passing through the processing block B2. The main transport mechanism TB2 of the processing block B2 delivers the substrate W to and from the processing unit U in the processing block B2 using the arms 61c and 61a, the arm 61c holding the substrate W6 of the received two substrates W1 and W6 to be processed in the processing block B2, the arm 61a holding no substrate W. That is, the main transport mechanism TB2 delivers the substrates W4 and W6 to and from the processing unit U using the two arms 61a and 61c.

Figure 13B:
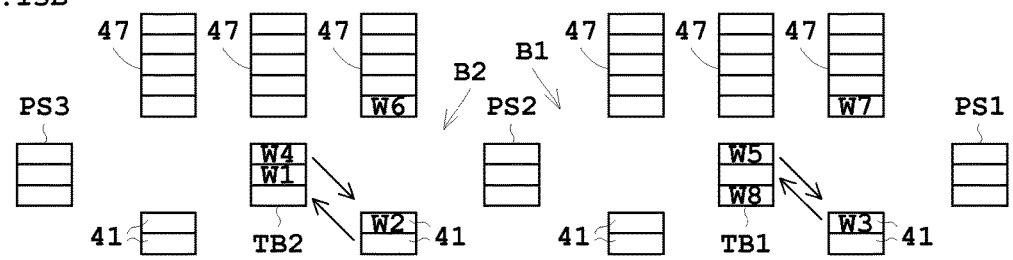
Figure 14:
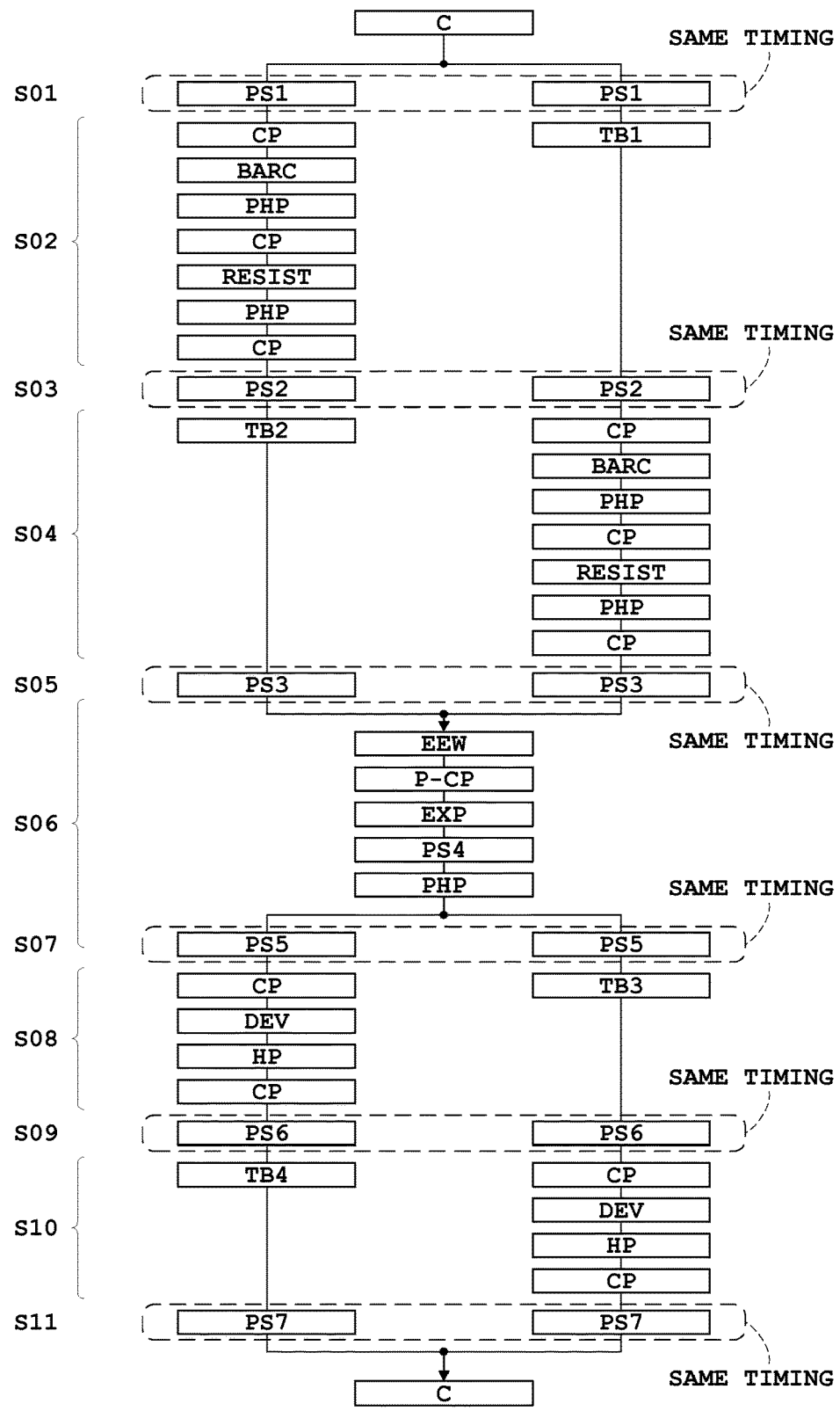
FIG. 14 is a flow chart of operation of the substrate treating apparatus.

In FIG. 13B, like the construction in FIG. 12D, the main transport mechanism TB1 of the processing block B1 delivers the substrate W to and from the processing unit U in the processing block B1 using the arms 61a and 61b, the arm 61a holding the substrate W5 of the received two substrates W5 and W8 to be processed in the processing block B1, the arm 61b holding no substrate W. That is, the main transport mechanism TB1 delivers the substrates W3 and W5 to and from the processing unit U using the two arms 61a and 61b.

The main transport mechanism TB2 of the processing block B2 delivers the substrates W to and from the processing unit U in the processing block B2 using the arms 61a and 61c, the arm 61a holding the substrate W4 of the received two substrates W1 and W4 to be processed in the processing block B2, and the arm 61c holding no substrate W. That is, the main transport mechanism TB2 delivers the substrates W2 and W4 to and from the processing unit U using the two arms 61a and 61c. Here in FIGS. 13A and 13B, the arm 61b of the main transport mechanism TB2 keeps holding the substrate W1.

Figure 13C:
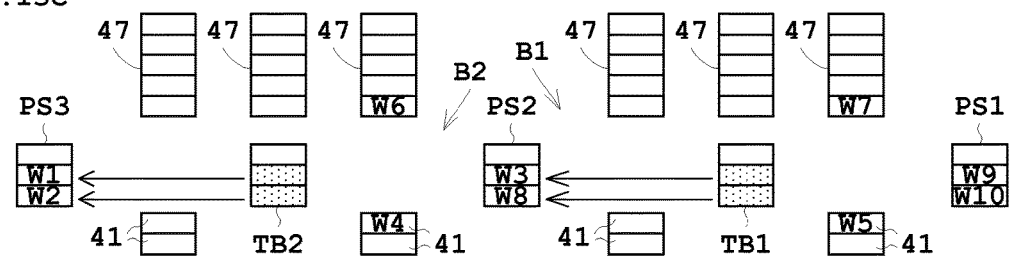
Figure 13D:
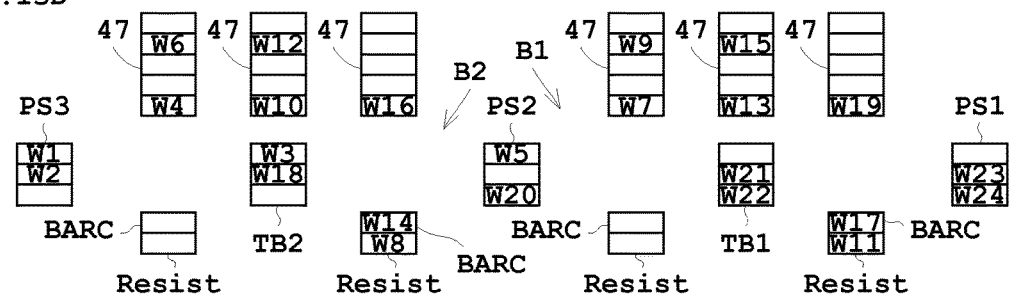

In FIG. 13C, like the construction in FIG. 12E, the main transport mechanism TB1 of the processing block B1 transfers the two substrates W3 and W8 simultaneously via the mount table PS2 to the downstream processing block B2 using the arms 61b and 61c, the arm 61b holding the substrate W3 being subjected to a given process in the processing block B1, and the arm 61c holding the substrate W8. That is, the main transport mechanism TB1 transports the two substrates W3 and W8 simultaneously to the mount table PS2.

The main transport mechanism TB2 of the processing block B2 transfers the two substrates W1 and W2 simultaneously via the mount table PS3 to the downstream IF section 7 using the arms 61c and 61b, the arm 61c holding the substrate W2 subjected to the given process in the processing block B2 and the arm 61b holding the substrate W1. That is, the main transport mechanism TB2 transports the two substrates W1 and W2 simultaneously to the mount table PS3. At this time, the arm holder 63 of the main transport mechanism TB2 is located adjacent to the downstream IF section 7 (adjacent to the mount table PS3) along the transportation path RA.

One repeat of the operation in FIGS. 12F to 13C causes the mount table PS3 to contain the two transported substrates W3 and W4.

The following describes a flowchart about the operation of the substrate treating apparatus 1 with reference to FIG. 14. FIG. 14 illustrates Steps S01 to S11 in which the substrates W are fed out from the carrier C on the carrier mount table 9 (see FIG. 5), subjected to a given process, and accommodated (returned) in the carriers C. Firstly, application processing by the two (n) processing blocks B1 and B2 in Steps S01 to S5 is to be described, and thereafter, processing by the IF section 7 and the exposing machine EXP in Step S06 is to be described.

[Step S01] Substrate Transportation Via Mount Table PS1

A user or a carrier transport device (not shown) transports the carrier C accommodating the substrates W to the carrier mount table 9 of the ID section 3. The transport mechanism TA1 in the ID section 3 feeds out a substrate W from the carrier C and transports the substrate W to the mount table PS1. The transport mechanism TA1 transports the substrates W accommodated in the carrier C to the mount table PS1 successively.

The main transport mechanism TB1 receives two (n) substrates W simultaneously from the upstream ID section 3 via the mount table PS1 using lower two (n) arms 61b and 61c of three (n+1) arms 61a to 61c. See FIG. 12B. At this time, the arm holder 63 of the main transport mechanism TB1 is located adjacent to the upstream ID section 3 along the transportation path RA. The received two substrates W are not subjected to the same processing (application processing).

[Step S02] Process by Processing Block B1

The processing block B1 performs a series of processes concerning the application processing. The series of processes includes seven processes in the cooling unit CP, an antireflection film application processing unit BARC, a heating-cooling unit PHP, a cooling unit CP, a resist film application processing unit RESIST, a heating-cooling unit PHP, and a cooling unit CP performed in this order. An adhesion reinforcement processing unit PAHP may be used as necessary. The application processing does not need to include the above seven processes, but may include other numbers of processes. Alternatively, the seven processes may be performed in the processing block B1 in parallel.

At this time, the main transport mechanism TB1 proceeds with the application processing in the processing block B1 with the remaining two arms while holding one substrate W of the two substrates W received from the mount table PS1. See FIGS. 12C and 12D.

That is, the one substrate W of the receiver two substrates W are processed in the processing block B1. The remaining one substrate W is held with the arm 61c, for example, for the next processing block B2. Specifically, the main transport mechanism TB1 delivers (replaces) the substrate W to and from the processing unit U in the processing block B1 using the arms 61b and 61a, the arm 61b holding the substrate W of the two (n) substrates W to be processed in the processing block B1, and the arm 61b holding no substrate W. In addition, the main transport mechanism TB1 keeps holding the one (n−1) substrate W with the remaining one (n−1) arm 61c receiving the substrate W while the delivered substrate W is processed in the processing unit U. That is, the main transport mechanism TB1 keeps holding one substrate W while another substrate W is delivered to and from the processing unit U.

In FIGS. 12C and 12D, the main transport mechanism TB1 keeps holding the substrate W6 using the arm 61c while the processing unit U processes the delivered substrate W. The processing during the process of the substrate W by the processing unit U corresponds to a process in seven processing units U, such as the cooling unit CP, in step S02 in FIG. 14, and corresponds to a process by two processing units where the substrates W1 and W5 exist in FIG. 12C. That is, in FIGS. 12B to 12D, a period of time while the processing unit U processes the substrate W corresponds to time from when the main transport mechanism TB1 receives the substrates W5 and W6 simultaneously to time when the main transport mechanism TB1 delivers the substrate W to and from the processing unit U and receives the substrate W1 processed in the two processing units U. Here, the constructions of the main transport mechanisms TB2 to TB4 are each similar to the construction of the main transport mechanism TB1.

[Step S03] Substrate Transportation Via Mount Table PS2

Either the arm 61a or 61b transferring and receiving the substrate W with the processing unit U receives the substrate W subjected to a given process in the processing block B1 (step S2). Thereafter, the main transport mechanism TB1 transfers the two substrate W to the downstream processing block B2 via the mount table PS2 using the arm 61b and 61c, the arm 61b holding the substrate W subjected to a given process in the processing block B1, and the one (n−1) arm 61c holding the one (n−1) substrate W. See FIG. 12E. That is, the main transport mechanism TB1 transports the two substrates W, i.e., the substrate W subjected to the process in the processing block B1 and the substrate W to be subjected to a process in the processing block B2, to the mount table PS2. At this time, the arm holder 63 of the main transport mechanism TB1 is located adjacent to the downstream processing block B2 along the transportation path RA.

The main transport mechanism TB1 in the processing block B1 transports the substrate W to the mount table PS2, and thereafter, the main transport mechanism TB2 in the processing block B2 receives the two substrates W simultaneously from the upstream processing block B1 via the mount table PS2 using the lower two arm 61b and 61c of the three arms 61a to 61c. See FIG. 12F. At this time, the arm holder 63 of the main transport mechanism TB2 is located adjacent to the upstream processing block B1 along the transportation path RA.

Moreover, in FIGS. 12B to 12F, the transport mechanism TA1 in the ID section 3 transports two substrates W to be processed next in the two processing block B1 and B2 to the mount table PS1 while the two substrates W are transported from the mount table PS1 to the mount table PS2. The main transport mechanisms TB1 and TB2 receive the two substrates W at substantially the same timing.

[Step S04] Process by Processing Block B2

The processing block B2 performs a series of given processes concerning application processing. Since the processing block B2 performs the same process as the process of the processing block B1 in Step S02, the series of processes is to be omitted.

The main transport mechanism TB2 delivers (replaces) the substrates W to and from the processing unit U in the processing block B2 using one arm 61c and one arm 61a, the arm 61c holding one substrate W of the received two substrates W to be processed in the processing block B2, and the arm 61a holding no substrate W. See FIGS. 13A and 13B. Moreover, the main transport mechanism TB2 keeps holding one substrate W with the remaining one arm 61b having received the substrate W while the substrates W are processed in the processing units U. The held substrate W is the substrate W processed by the processing block B1.

[Step S05] Substrate Transportation Via Mount Table PS3

Either the arm 61a or the arm 61c that delivers the substrates W to and from the processing unit U receives the substrate W subjected to the given process in the processing block B2 (Step S4). Thereafter, the main transport mechanism TB2 transfers the two substrate W to the downstream IF section 7 via the mount table PS3 using the arm 61c and 61b, the arm 61c holding the substrate W subjected to a given process in the processing block B2, and the arm 61b holding the substrate W. See FIG. 13C. That is, the main transport mechanism TB2 transports the two substrates W subjected to the process in the processing blocks B1 and B2 to the mount table PS3. At this time, the arm holder 63 of the main transport mechanism TB2 is located adjacent to the downstream IF section 7 along the transportation path RA.

As noted above, the two substrates W transported to the mount table PS3 at the same timing are substrates W subjected to the application processing in the processing blocks B1 and B2. Consequently, at the mount table PS3, the two processing blocks B1 and B2 have already performed the application processing simultaneously to the two substrates. That is, the two processing blocks B1 and B2 perform parallel processing. The two main transport mechanism TB1 and TB2 each hold the substrate W with the arm 61c while transferring and receiving (replacing) the substrate W with the processing unit U as usual using the remaining arms 61a and 61b in the processing blocks B1 and B2. In addition, the processing blocks B1 and B2 perform the same application processing. This achieves the decreased number of substrate W transportation steps. Moreover, the processing units U has almost the substantially number of substrate W transportation steps, achieving substantially the same time for application processing by the processing blocks B1 and B2.

The main transport mechanism TB1 receives two substrates W simultaneously from the upstream ID section 3. The main transport mechanism TB1 transfers two substrates W simultaneously to the downstream processing block B2. Consequently, a shortened substrate transportation time is obtainable, resulting in enhanced throughput of the substrate treating apparatus 1.

After the mount table PS3 receives the substrates W, a first transport mechanism TC1 adjacent to the processor in the IF section 7 in FIG. 5 receives the substrates W from the mount table PS3.

[Step S06] Process by IF Section 7 and Exposing Machine EXP

The IF section 7 conducts pre-processing and post-processing for the exposing machine EXP as an external apparatus performing exposure. Transport mechanisms TC1, TC2, and TD transport the substrates W. The substrates W are processed by an edge exposure unit EEW, a mounting-cum-cooling unit PASS-CP, an exposing machine EXP, a mount table PS4, and heating-cooling unit PHP in this order. In addition, a pre-exposure cleaning unit 21 and a post-exposure cleaning unit 23 may process the substrates W as necessary.

The following describes a developing step in Steps S07 to S11 by the two processing blocks B3 and B4. Here, the processing blocks B3 and B4 transport the substrates in a similar manner to the processing blocks B1 and B2, and thus the description thereof is to be made simply. In FIGS. 12B to 13C, the construction of the processing block B1 is referred for the construction of the processing block B3, and the construction of processing block B2 is referred for the construction of the processing block B4.

[Step S07] Substrate Transportation Via Mount Table PS5

The transport mechanism TC2 transports the substrates W processed by the heating-cooling unit PHP in IF section 7 to the mount table PS5. The main transport mechanism TB3 of the processing block B3 receives two substrates W placed in the mount table PS5 simultaneously using the lower two arms 61b and 61c of the three arms 61a to 61c. See FIG. 12B.

[Step S08] Process by Processing Block B3

The processing block B3 performs a series of given processes concerning the developing step. The series of processes corresponds to four processes performed by the cooling unit CP, the developing process unit DEV, the heating unit HP, and the cooling unit CP, in this order. At this time, the main transport mechanism TB3 holds one of the two substrates W received from the mount table PS5 while proceeding with the developing steps (processing) in the processing block B3 using the remaining two arms 61a and 61b. See FIGS. 12C and 12D. Moreover, the heating-cooling unit PHP may perform processing as necessary. Moreover, the developing step is not limited to the four processes. Alternatively, the developing step may have another number of processes. Alternatively, the four processes may be performed in parallel by the processing block B3.

[Step S09] Substrate Transportation Via Mount Table PS6

The main transport mechanism TB3 transports the two substrates W, i.e., the substrate W processed in the processing block B3 and the substrate W to be processed in the processing block B4, to the mount table PS6. See FIG. 12E.

After the main transport mechanism TB3 of the processing block B3 transports the substrates W to the mount table PS6, the main transport mechanism TB4 of the processing block B4 receives the two substrates W placed in the mount table PS6 simultaneously using the lower two arms 61b and 61c of the three arms 61a to 61c. See FIG. 12F.

In FIGS. 12B to 12F, the transport mechanism TC2 of the IF section 7 transports two substrates W to be processed next in the two processing blocks B3 and B4 to the mount table PS5 while the two substrates W in the mount table PS5 are transported to the mount table PS6. The two main transport mechanisms TB3 and TB4 each receive the two substrates W at substantially the same timing.

[Step S10] Process by Processing Block B4

The processing block B4 performs a series of processes concerning a developing step. The processing block B4 performs the same process as the processing block B3 in Step S08, and thus the description thereof is to be omitted. The main transport mechanism TB4 holds one of the two substrates W received from the mount table PS6 while proceeding with the developing step in the processing block B4 using the remaining two arms 61a and 61c. See FIGS. 13A and 13B.

[Step S11] Substrate Transportation Via Mount Table PS7

The main transport mechanism TB4 transports the two substrates W subjected to developing processing by the two processing blocks B3 and B4 to the mount table PS7. See FIG. 13C. After the main transport mechanism TB4 transports the substrates W to the mount table PS7, the transport mechanism TA2 of the ID section 3 in FIG. 3 receives the substrates W transported to the mount table PS7, and accommodates the substrates W to the carrier C of the carrier mount table 9. Here, the substrates W are subjected to the application processing, exposure processing, and developing processing. Then, all the substrates W are returned, and thereafter, the user or the carrier transport mechanism (not shown) moves the carrier C from the carrier mount table 9.

The carriers C with all the substrates W removed therefrom are moved from the carrier mount table 9 adjacent to the transport mechanism TA1 to the carrier mount table 9 adjacent to the transport mechanism TA2. The main transport mechanisms TB1 to TB4 of the processing blocks B1 to B4 are individually controlled by sensors provided in the mount tables PS1 to PS3 and PS5 to PS7. The sensors each detect presence or absence of the substrate W.

The substrate transport mechanisms TB1 to TB4 of the embodiment include three arm 61a to 61c corresponding to the number of two processing blocks. The following describes operation of the substrate transport mechanisms TB1 to TB4 taking the substrate transport mechanism TB1 as one example. The substrate transport mechanism TB1 receives the two substrates W from the upstream ID section 3 using the two arms 61b and 61c of the three arms 61a to 61c. Then, the substrate transport mechanism TB1 delivers the substrates W to and from the processing unit U of the processing block B1 using the arm 61b holding one of the two substrates W to be processed in the processing block B1 and the arm 61a holding no substrate W. The substrate transport mechanism TB1 keeps holding one substrate W with the remaining one (n−1) arm 61c of the arms having received the substrates W while the substrate W is processed in the processing unit U. Thereafter, the substrate transport mechanism TB1 transfers the two substrates W to the downstream processing block B2 using the arm 61a holding the substrate W subjected to a given process by the processing block B1 and the arm 61c holding the substrate W.

That is, the substrate transport mechanism TB1 delivers (replaces) the substrate W to and from the processing unit U in the processing block B1 as usual while holding the substrate W passing through the processing block B1 using the arm 61c for performing the application process (processing) to the processing block B1. Like the processing block B1, the substrates are transported in the next processing block B2 to be subjected to the same application process. This results in a reduced number of transportation steps. In addition, the processing blocks B1 and B2 have approximately the same number of substrate transportation steps to the processing unit. This causes substantially the same time for processing in the processing blocks B1 and B2. Accordingly, suppressing reduction in processing efficiency of parallel processing between the processing blocks B1 and B2 as well as between the processing blocks B3 and B4 is obtainable.

The embodiment of the present invention achieves approximately the same number of substrate W transportation steps. Alternatively, to obtain more approximately the same number thereof, the processing blocks B1 and B2 as well as the processing blocks B3 and B4 may have the same arrangement or the same number of processing units U.

The substrate transport mechanisms TB1 to TB4 each further include an arm holder 63 that supports the arms 61a to 61c so as to move the arms horizontally and to be movable along the transportation paths RA and RB. For instance, when the arm holder 63 is located adjacent to the upstream ID section 3 along the transportation path RA, the substrate transport mechanism TB1 receives two substrates W from the upstream ID section 3. When the arm holder 63 is located adjacent to the downstream processing block B2 along the transportation path RA, the substrate transport mechanism TB1 transfers two substrates to the downstream processing block B2.

This achieves suppressing reduction in processing efficiency of parallel processing among the processing blocks with the arm holder 63 holding the arms 61a to 61c being moved when the two substrates W are received from the upstream ID section 3 or are transferred to the downstream processing block B2.

In addition, the substrate treating apparatus 1 further includes the mount table PS2 provided between the adjacent processing blocks B1 and B2. The mount table P2 places the substrate W thereon for transferring or receiving the substrate W. Consequently, the substrate W to be transferred or received to or from the two adjacent processing blocks B1 and B2 is placed on the mount table PS2, resulting in ready transfer or receipt of the substrate W.

The mount table PS2 allows either transfer or receipt of three substrates W. In addition, the mount table PS2 allows either receipt or transfer of the substrate W simultaneously using the three arms 61a to 61c. This achieves shortened substrate transportation time in the mount table PS2, resulting in enhanced throughput of the substrate treating apparatus.

The transportation path RA and the transportation path RB are arranged in parallel. The processing blocks B1 to B4 each transport the substrate W in the first direction along the transportation path RA while performing the application process, and transport the substrate W in the second direction, opposite to the first direction, along the transportation path RB while performing the developing process performed differently along the transportation path RA. This achieves transportation of the substrate W in one direction so as for the substrate W to circulate along the transportation paths RA and RB in the substrate treating apparatus 1, resulting in enhanced throughput of the substrate treating apparatus 1.

Embodiment 2

Figure 15:
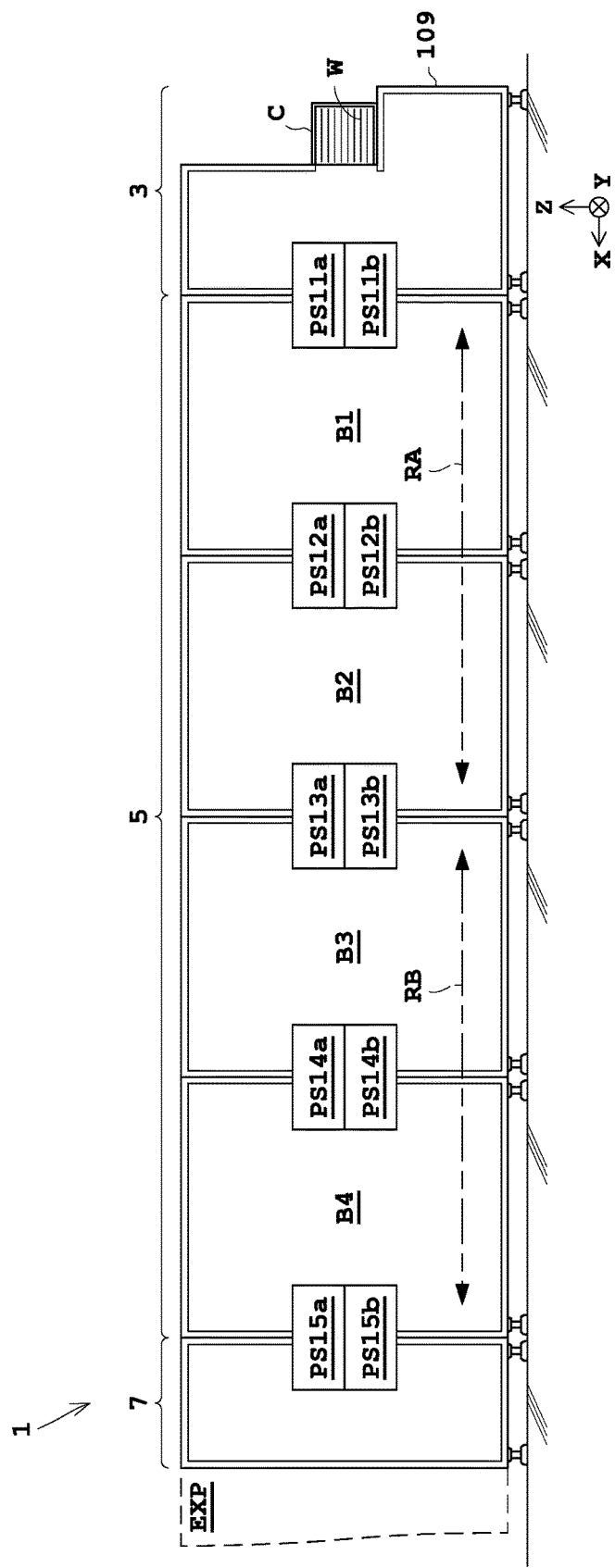
FIG. 15 is a side view of a substrate treating apparatus according to another embodiment of the present invention.

The following describes Embodiment 2 of the present invention with reference to drawings. FIG. 15 is a side view of a substrate treating apparatus 1 according to Embodiment 2. Here, the description common to that of Embodiment 1 is to be omitted.

In Embodiment 1, as illustrated in FIG. 5, the two transportation paths RA and RB are arranged in parallel. The lower two processing blocks B1 and B2 and the upper two processing blocks B3 and B4 are laminated vertically. The four processing blocks B1 to B4 transport the substrates W from the ID section 3 to IF section 7 along the transportation path RA in the first direction while performing the application process, and transport the substrates W along the transportation path RB in the second direction, opposite to the first direction, while performing the developing process. That is, the four processing blocks B1 to B4 transport the substrates W in one direction.

In contrast to this, in Embodiment 2, two transportation paths RA and RB are arranged in series, and four processing blocks B1 and B4 are arranged horizontally, as illustrated in FIG. 15. The four processing blocks B1 to B4 transport substrates W from an ID section 3 to an IF section 7 along the two transportation paths RA and RB in a first direction while performing an application process along the transportation path RA, and transport the substrates W along the two transportation paths RA and RB in a second direction, opposite to the first direction, while performing a developing process along the transportation path RB. That is, the four processing blocks B1 to B4 transport the substrates W bi-directionally.

As illustrated in FIG. 15, a mount table PS11a and a mount table PS11b are provided between the ID section 3 and the processing block B1. The mount table PS11a transports the substrates W in the first direction, and the mount table PS11b transports the substrates in the second direction. Likewise, mount tables PS12a to PS14a and mount tables PS12b to PS14b are provided each among the two adjacent processing blocks B1 to B4. The mount tables PS12a to PS14a transport the substrates W in the first direction. The mount tables PS12b to PS14b transport the substrates W in the second direction. Moreover, mount table PS15a and mount table PS15b are provided between the processing block B4 and the IF section 7. The mount table PS15a transports the substrate W in the first direction, and the mount table PS15b transports the substrates W in the second direction.

Here, the two processing blocks B1 and B2 may be exchanged with the two processing blocks B3 and B4 such that an application process is performed along the transportation path RB and a developing process is performed along the transportation path RA. Moreover, the processor 5 in FIG. 15 is formed by one layer. Alternatively, the processor 5 may be formed by two layers vertically. Moreover, the processor 5 may be formed by more than two rows in a depth direction of FIG. 15 (Y-direction).

Figure 16A:
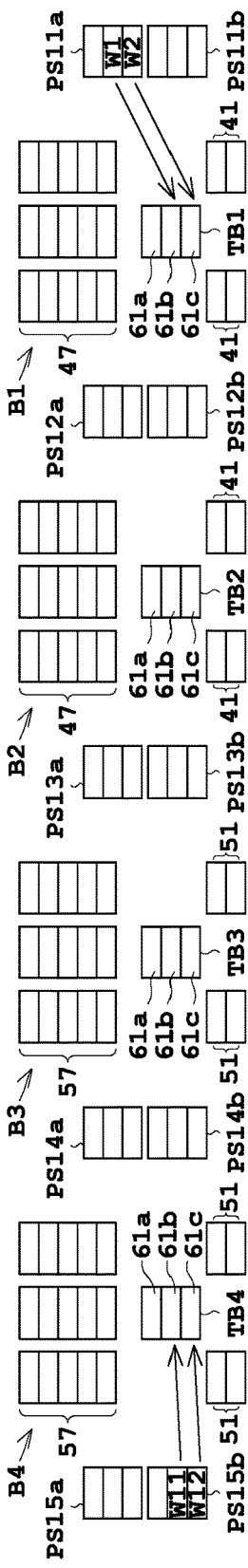
Figure 16B:
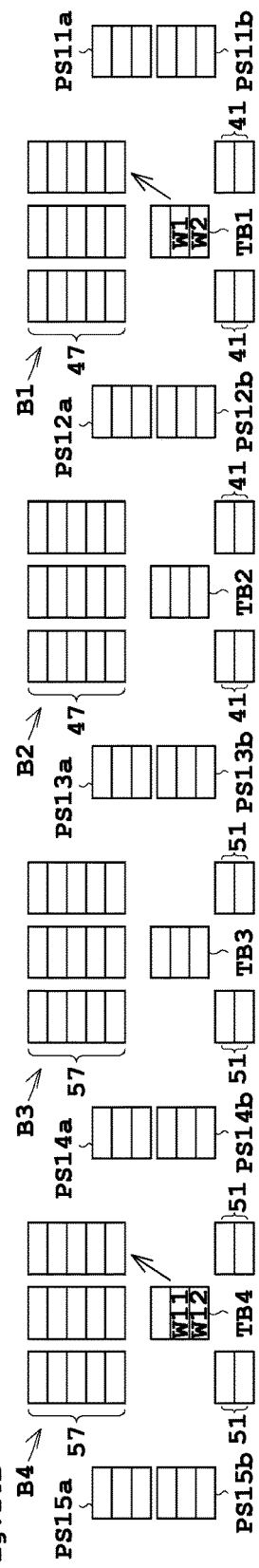
Figure 16C:
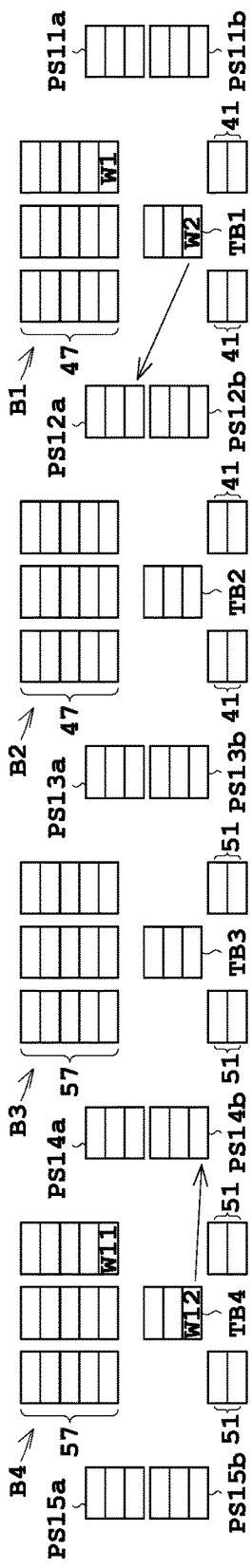
Figure 17A:
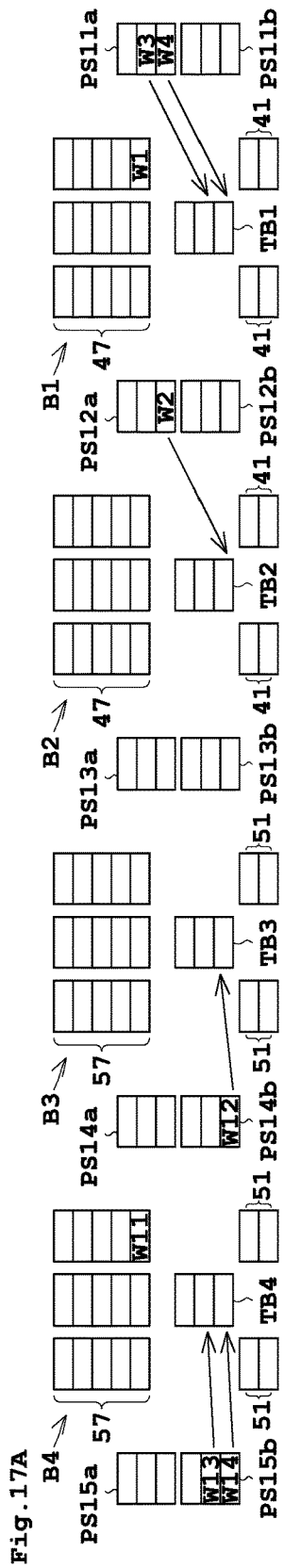
Figure 17B:
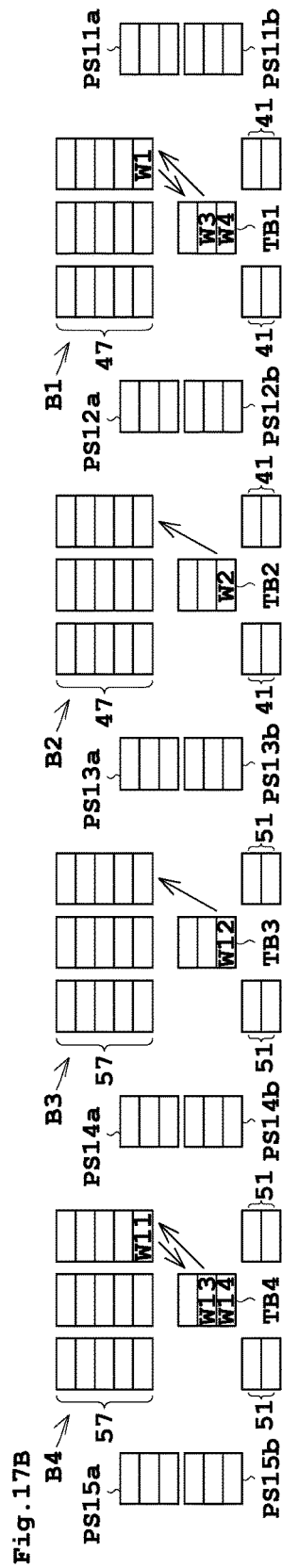
Figure 17C:
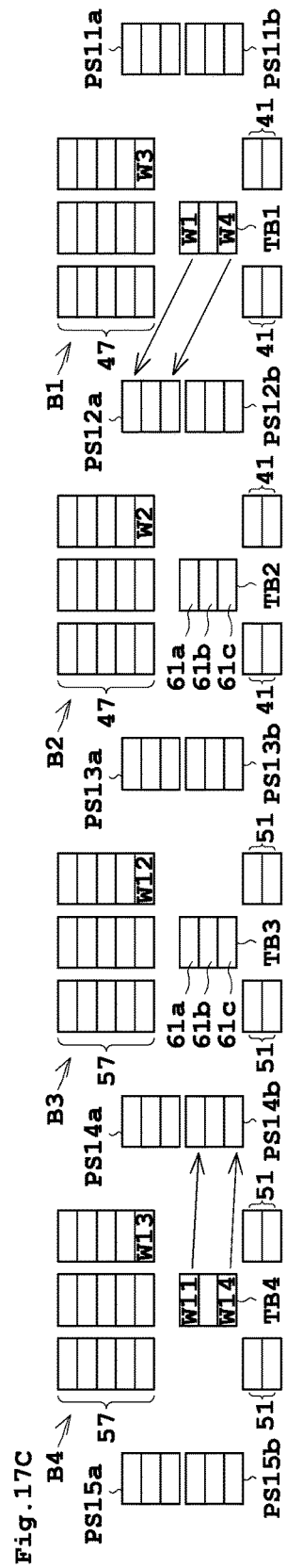

The following describes operation of the processor 5 of the substrate treating apparatus 1. FIGS. 16A to 16C (hereinafter, referred to as "FIG. 16" as appropriate), FIGS. 17A to 17C (hereinafter, referred to as "FIG. 17" as appropriate), and FIGS. 18A to 18C (hereinafter, referred to as "FIG. 18" as appropriate) each illustrate operation of four main transport mechanisms TB1 to TB4. FIG. 17A is illustrated followed by FIG. 16C, and FIG. 18A is illustrated followed by FIG. 17C.

Here, an application process by the two processing blocks B1 and B2, and a developing process by the two processing blocks B3 and B4 are same as those in Embodiment 1, and thus the description thereof is to be omitted. In FIGS. 16 to 18, for simpler illustration of substrate transportation, one processing unit U completes processing to a substrate, and thereafter transports the substrate to a next processing block. The main transport mechanisms TB1 to TB4 in the processing blocks B1 to B4, respectively, transport substrates W in the same manner as in FIGS. 11 to 13. Consequently, the description thereof is to be omitted. FIGS. 16 to 18 include numerals W1, W2 and the like each indicating a number of a substrate W transported in order to the mount table PS1 and the like. The substrate is indicated as the "substrate W" when no distinguish is made to the number given to the substrate W.

FIGS. 16 to 18 illustrates operation in the first direction from the processing block B1 to the processing block B4 and operation in the second direction from the processing block B4 to the processing block B1. The substrates are transported in a similar manner.

In FIG. 18D, the main transport mechanism TB3 in the processing block B3 transports two substrates W to the mount table PS14a, the substrates W being subjected to the application process by the processing blocks B1 and B2 and placed on the mount table PS13a. The main transport mechanism TB4 in the processing block B4 transports the substrates W transported by the mount table PS14a to the mount table PS15a.

As noted above, for transporting the substrates W from the processing block B1 to the processing block B4, the two processing blocks B1 and B2 perform the application process, and the two processing blocks B3 and B4 perform only transportation for passing the substrates. The following describes one example of the transportation for passing the substrates. Specifically, in FIG. 17C, the main transport mechanism TB1 transports two substrates W to the mount table PS12a, and thereafter receives two substrates W placed on the mount table PS12b subjected to the developing process. Then, the main transport mechanism TB1 performs transportation for passing the substrates through the processing block B1 to transport the substrates to the mount table PS11b, and receives two substrates W to be subjected to application process by the two processing blocks B1 and B2 from the mount table PS11a. Such a substrate transporting method is performed in a similar manner in the processing blocks B2 to B4.

With the embodiment, the same effect as that of Embodiment 1 is obtainable and bi-directionally transportation of the substrate W is also obtainable along the transportation paths RA and RB in the substrate treating apparatus 1.

The present invention is not limited to the foregoing examples, but may be modified as follows.

(1) In each of the embodiments mentioned above, the two processing blocks B1 and B2 are provided, for example, along the transportation path RA. Such two processing blocks are not limitative. That is, three or more processing blocks may be provided along the same transportation path. For instance, when three processing blocks are provided, the main transport mechanisms of the processing blocks each include four (3+1) arms. Moreover, in this case, the substrate transport mechanism holds a substrate W to pass through the processing block provided with the substrate transport mechanism using two (3−1) arms while transferring and receiving (replacing) the substrate W with the processing unit U as usual.

(2) In each of the embodiments and modification (1) mentioned above, the substrate W is subjected to either transfer or receipt via the mount tables PS1 to PS3 and PS5 to PS7. However, the substrate W may be subjected to either transfer or receipt using the arms of the main transport mechanism TB1 and the main transport mechanism TB2.

(3) In each of the embodiments and the modifications mentioned above, the arm holders 63 of the main transport mechanisms TB1 to TB4 are each movable along the two transportation paths RA and RB. However, the arm holders 63 of the main transport mechanisms TB1 to TB4 may each be fixed in every direction along the two transportation paths RA and RB. For instance, when the substrate W may be delivered between the upstream or downstream block and the processing unit without moving the arm holder 63, the arm holder 63 may be fixed in the direction along the two transportation paths RA and RB.

(4) In each of the embodiments and the modifications mentioned above, the main transport mechanisms TB1 to TB4 each deliver the substrate W to and from the processing unit U while holding the substrate W to pass through the processing blocks B1 to B4. At this time, the main transport mechanism TB1 to TB4 may each deliver (replace) the substrate W to and from the processing unit U below the arm 61a holding the substrate W. This achieves suppressed adhesion of dust on the held substrate W, the dust being possibly generated even when the arm, other than the arms holding the substrates W, delivers the substrate W to and from the processing unit U.

Moreover, as illustrated in FIG. 12A, when the substrate W in the mount table PS1 passing through the processing block B1 is below the substrate W to be processed by the processing block B1, another transport mechanism may replace the substrate W. Moreover, the mount table PS1 may have a construction that allows replacement of positions of the substrates W. Moreover, when the main transport mechanism BT1 receives the substrate W from the mount table PS1, a timing for receiving the substrate W may be shifted so as for the substrate W passing through the processing block B1 to be received with an arm above the arm for transferring and receiving the substrate W with the processing unit U.

The present invention may be embodied in other specific forms without departing from the spirit or essential attributes thereof and, accordingly, reference should be made to the appended claims, rather than to the foregoing specification, as indicating the scope of the invention.

REFERENCE SIGNS LIST

1 . . . substrate treating apparatus
3 . . . indexer (ID section)
5 . . . processor
7 . . . interface (IF section)
31 . . . main controller
61a to 61c . . . arm
63 . . . arm holder
67 . . . first guide rail
69 . . . second guide rail
RA, RB . . . transportation path
U . . . processing unit
TB1 to TB4 . . . main transport mechanism
PS1 to PS7 . . . mount table
PS11a to PS15a . . . mount table
PS11b to PS15b . . . mount table

What is claimed is:
1. A substrate treating apparatus for treating substrates, the substrate treating apparatus comprising:
n processing blocks arranged along a transportation path, n being a natural number of 2 or larger,
an individual processing block of the n processing blocks performing a process equal to that performed by another processing block of the n processing blocks to the substrates, and including at least one processing unit performing a predetermined process to the substrates, and a single substrate transport mechanism having n+1 arms holding the substrates,
the substrate transport mechanism in a target processing block of the n processing blocks receiving n substrates of the substrates from an upstream block using n arms of the n+1 arms,
the substrate transport mechanism in the target processing block delivering one substrate of the received n substrates to and from the processing unit in the target processing block using one arm of the n+1 arms holding the one substrate of the n substrates to be subjected to a given process by the target processing block and one arm of the n+1 arms holding no substrate,
the substrate transport mechanism in the target processing block holding n−1 substrate or substrates of the n substrates using remaining n−1 arm or arms of the n+1 arms with which the n substrates are received from when the substrate transport mechanism in the target processing block receives the n substrates until when the substrate transport mechanism in the target processing block receives one substrate of the substrates subjected to the given process by the target processing block, and
the substrate transport mechanism in the target processing block transferring n substrates to a downstream block using the one arm of the n+1 arms holding the one substrate subjected to the given process by the target processing block and the n−1 arm or arms of n+1 arms holding the n−1 substrate or substrates not subjected to the given process by the target processing block.

2. The substrate treating apparatus according to claim 1, wherein
the substrate transport mechanism further comprises an arm holding table holding the arms so as for the arms to be movable horizontally and to be movable along the transportation path, and the substrate transport mechanism receives the n substrates from the upstream block when the arm holding table is located adjacent to the upstream block on the transportation path.

3. The substrate treating apparatus according to claim 2, wherein
the substrate transport mechanism further comprises the arm holding table holding the arms so as for the arms to be movable horizontally and to be movable along the transportation path, and the substrate transport mechanism transfers the n substrates to the downstream block when the arm holding table is located adjacent to the downstream block on the transportation path.

4. The substrate treating apparatus according to claim 2, wherein
the substrate transport mechanism receives the n substrates simultaneously from the upstream block.

5. The substrate treating apparatus according to claim 2, further comprising:
a mount table between the adjacent upstream and downstream blocks for placing the substrate so as to perform transfer or receipt of the substrate to or from the block.

6. The substrate treating apparatus according to claim 2, wherein
the substrate transport mechanism delivers the substrate to and from the processing unit of the processing block below the arm holding the substrate.

7. The substrate treating apparatus according to claim 2, wherein
the transportation path includes first and second transportation paths arranged in parallel, and the n processing blocks are first n processing blocks arranged along the first transportation path,
the substrate treating apparatus further includes second n processing blocks arranged along the second transportation path and having a same configuration as the n processing blocks,
the first n processing blocks perform processing while transporting the substrate along the first transportation path in a first direction, and
the second n processing blocks perform processing, different from the processing along the first transportation path, while transporting the substrate along the second transportation path in a second direction opposite to the first direction.

8. The substrate treating apparatus according to claim 2, wherein
the transportation path includes first and second transportation paths arranged in series, and the n processing blocks are first n processing blocks arranged along the first transportation path,
the substrate treating apparatus further includes second n processing blocks arranged along the second transportation path and having a same configuration as the n processing blocks,
the first n processing blocks perform processing along the first transportation path, while the first n processing blocks and the second n processing blocks transport the substrate along the first and second transportation paths, respectively, in a first direction, and
the second n processing blocks perform processing along the second transportation path, different from the processing along the first transportation path, while the first n processing blocks and the second n processing blocks, transport the substrate along the first and second transportation paths, respectively, in a second direction opposite to the first direction.

9. The substrate treating apparatus according to claim 1, wherein
the substrate transport mechanism further comprises an arm holding table holding the arms so as for the arms to be movable horizontally and to be movable along the transportation path, and the substrate transport mechanism transfers the n substrates to the downstream block when the arm holding table is located adjacent to the downstream block on the transportation path.

10. The substrate treating apparatus according to claim 9, wherein
the substrate transport mechanism transfers the n substrates simultaneously to the downstream block.

11. The substrate treating apparatus according to claim 1, wherein
the substrate transport mechanism receives the n substrates simultaneously from the upstream block.

12. The substrate treating apparatus according to claim 1, wherein
the substrate transport mechanism transfers the n substrates simultaneously to the downstream block.

13. The substrate treating apparatus according to claim 1, further comprising:
a mount table between the adjacent upstream and downstream blocks for placing the substrate so as to perform transfer or receipt of the substrate to or from the block.

14. The substrate treating apparatus according to claim 13, wherein
the mount table allows placement of the n+1 substrates as well as either transfer or receipt of the substrates using the n+1 arms simultaneously.

15. The substrate treating apparatus according to claim 1, wherein
the substrate transport mechanism delivers the substrate to and from the processing unit of the processing block below the arm holding the substrate.

16. The substrate treating apparatus according to claim 1, wherein
the transportation path includes first and second transportation paths arranged in parallel, and the n processing blocks are first n processing blocks arranged along the first transportation path,
the substrate treating apparatus further includes second n processing blocks arranged along the second transportation path and having a same configuration as the n processing blocks,
the first n processing blocks perform processing while transporting the substrate along the first transportation path in a first direction, and
the second n processing blocks perform processing, different from the processing along the first transportation path, while transporting the substrate along the second transportation path in a second direction opposite to the first direction.

17. The substrate treating apparatus according to claim 1, wherein the transportation path includes first and second transportation paths arranged in series, and the n processing blocks are first n processing blocks arranged along the first transportation path, the substrate treating apparatus further includes second n processing blocks arranged along the second transportation path and having a same configuration as the n processing blocks, the first n processing blocks perform processing along the first transportation path, while the first n processing blocks and the second n processing blocks transport the substrate along the first and second transportation paths, respectively, in a first direction, and the second n processing blocks perform processing along the second transportation path, different from the processing along the first transportation path, while the first n processing blocks and the second n processing blocks transport the substrate along the first and second transportation paths, respectively, in a second direction opposite to the first direction.

18. A substrate transporting method for a substrate treating apparatus provided with n processing blocks arranged along a transportation path, n being a natural number of 2 or larger, an individual processing block of the n processing blocks performing a process equal to that performed by another processing block of the n processing blocks to the substrates, and having at least one processing unit performing a predetermined process to the substrates, and a single substrate transport mechanism having arms holding the substrates, the substrate transporting method, performed by the substrate transport mechanism in a target processing block of the n processing blocks, comprising;

receiving n substrates of the received substrates from an upstream block using n arms of n+1 arms provided with the substrate transport mechanism;

delivering one substrate of the n substrates to and from the processing unit in the target processing block using one arm of the n+1 arms holding the one substrate of the n substrates to be subjected to a given process by the target processing block and one arm of the n+1 arms holding no substrate;

holding n−1 substrate or substrates of the n substrates using remaining n−1 arm or arms of the n+1 arms with which the n substrates are received from when the substrate transport mechanism in the target processing block receives the n substrates until when the substrate transport mechanism in the target processing block receives one substrate of the substrates subjected to the given process by the target processing block; and transferring n substrates to a downstream block using the one arm of the n+1 arms holding the one substrate subjected to the given process by the target processing block and the n−1 arm or arms of the n+1 arms holding the n−1 substrate or substrates not subjected to the given process by the target processing block.

* * * * *